(12) United States Patent
Chun et al.

(10) Patent No.: US 12,538,521 B2
(45) Date of Patent: Jan. 27, 2026

(54) SEMICONDUCTOR DEVICES

(71) Applicant: SAMSUNG ELECTRONICS CO., LTD., Suwon-si (KR)

(72) Inventors: Kyungbin Chun, Suwon-si (KR); Jinbum Kim, Suwon-si (KR); Gyeom Kim, Suwon-si (KR); Dahye Kim, Suwon-si (KR); Youngkwang Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/215,254

(22) Filed: Jun. 28, 2023

(65) Prior Publication Data

US 2024/0170552 A1 May 23, 2024

(30) Foreign Application Priority Data

Nov. 23, 2022 (KR) ........................ 10-2022-0158595

(51) Int. Cl.
*H01L 29/423* (2006.01)
*H01L 29/06* (2006.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/015; H10D 64/018; H10D 64/021; H10D 84/013; H10D 84/0158; H10D 84/017;
(Continued)

(56) References Cited

U.S. PATENT DOCUMENTS 9,881,993 B2 1/2018 Ching et al.
10,930,498 B2 2/2021 Wang et al.
(Continued)

*Primary Examiner* — David C Spalla
(74) *Attorney, Agent, or Firm* — Morgan, Lewis & Bockius LLP

(57) ABSTRACT

A semiconductor device including channels spaced apart from each other on a substrate; a gate structure extending on the substrate, the gate structure surrounding lower and upper surfaces and sidewalls of each of the channels; and a source/drain layer on the substrate, the source/drain layer contacting sidewalls of the channels and containing silicon-germanium, the source/drain layer including: a second epitaxial layer having a second germanium concentration; and a first epitaxial layer having a first germanium concentration smaller than the second germanium concentration, the first epitaxial layer covering a lower surface and sidewalls of the second epitaxial layer, wherein the first epitaxial layer includes a protruding portion that protrudes in the first direction and contacts the gate structure, and wherein the protruding portion has a facet that is not curved.

20 Claims, 38 Drawing Sheets

(51) Int. Cl.
  *H01L 29/66* (2006.01)
  *H01L 29/775* (2006.01)
  *H01L 29/786* (2006.01)
  *H10D 30/01* (2025.01)
  *H10D 30/43* (2025.01)
  *H10D 30/67* (2025.01)
  *H10D 62/10* (2025.01)
  *H10D 64/01* (2025.01)

(52) U.S. Cl.
  CPC ....... *H10D 30/6757* (2025.01); *H10D 62/121* (2025.01); *H10D 64/017* (2025.01); *H10D 64/021* (2025.01)

(58) Field of Classification Search
  CPC . H10D 84/0193; H10D 84/834; H10D 84/853
  See application file for complete search history.

(56) References Cited

U.S. PATENT DOCUMENTS

| | | |
|---|---|---|
| 11,043,577 B2 | 6/2021 | Cheng et al. |
| 11,348,999 B2* | 5/2022 | Reznicek ............. H10D 62/116 |
| 11,398,550 B2 | 7/2022 | Lin et al. |
| 2021/0202747 A1* | 7/2021 | Young .................. H10D 30/024 |
| 2022/0157969 A1 | 5/2022 | Yin et al. |
| 2022/0181498 A1 | 6/2022 | Kim et al. |
| 2022/0367657 A1* | 11/2022 | Hsu ...................... H10D 62/118 |
| 2024/0113201 A1* | 4/2024 | Wang ................. H10D 30/6735 |
| 2024/0194764 A1* | 6/2024 | Wang ..................... H10D 30/43 |

\* cited by examiner

SEMICONDUCTOR DEVICES

CROSS-REFERENCE TO RELATED APPLICATION

This application claims priority under 35 U.S.C. § 119 to Korean Patent Application No. 10-2022-0158595 filed on Nov. 23, 2022 in the Korean Intellectual Property Office (KIPO), the disclosure of which is incorporated by reference herein in its entirety.

1. TECHNICAL FIELD

Example embodiments of the inventive concept set forth herein relate to semiconductor devices. More particularly, example embodiments of the inventive concept relate to semiconductor devices including a plurality of channels sequentially stacked in a vertical direction.

2. DESCRIPTION OF THE RELATED ART

In a method of manufacturing a semiconductor device with a plurality of channels sequentially stacked in a vertical direction, the following steps may be performed. A dummy gate structure and a gate spacer are formed on sacrificial lines and semiconductor lines that are alternately and repeatedly stacked vertically. An etching process is carried out using the dummy gate structure and the gate spacer as etching masks. This process etches the semiconductor lines and the sacrificial lines to form semiconductor patterns and sacrificial patterns, respectively. A source/drain layer is formed to contact sidewalls of the semiconductor patterns. An opening is formed through the sacrificial patterns by an etching process. A gate structure is then formed in the opening. However, when removing the sacrificial patterns, there is a possibility of damaging the source/drain layer.

SUMMARY

Example embodiments of the inventive concept provide a semiconductor device having enhanced characteristics.

Example embodiments of the inventive concept provide a method of manufacturing a semiconductor device having enhanced characteristics.

According to example embodiments of the inventive concept, there is provided a semiconductor device including: channels spaced apart from each other on a substrate in a third direction substantially perpendicular to an upper surface of the substrate, each of the channels extending in a first direction substantially parallel to the upper surface of the substrate; a gate structure extending on the substrate in a second direction substantially parallel to the upper surface of the substrate and crossing the first direction, the gate structure surrounding lower and upper surfaces and sidewalls of each of the channels; and a source/drain layer on the substrate, the source/drain layer contacting sidewalls of the channels and containing silicon-germanium, the source/drain layer including: a second epitaxial layer having a second germanium concentration; and a first epitaxial layer having a first germanium concentration smaller than the second germanium concentration, the first epitaxial layer covering a lower surface and sidewalls of the second epitaxial layer, wherein the first epitaxial layer includes a protruding portion that protrudes in the first direction and contacts the gate structure, and wherein the protruding portion has a facet that is not curved.

According to example embodiments of the inventive concept, there is provided a semiconductor device including: channels spaced apart from each other on a substrate in a third direction substantially perpendicular to an upper surface of the substrate, each of the channels extending in a first direction substantially parallel to the upper surface of the substrate; a gate structure extending on the substrate in a second direction substantially parallel to the upper surface of the substrate and crossing the first direction, the gate structure surrounding lower and upper surfaces and sidewalls of each of the channels; a gate spacer covering sidewalls of the gate structure; and a source/drain layer on the substrate, the source/drain layer contacting sidewalls of the channels and containing silicon-germanium, the source/drain layer including: a second epitaxial layer having a second germanium concentration; and a first epitaxial layer having a first germanium concentration smaller than the second germanium concentration, the first epitaxial covering a lower surface and sidewalls of the second epitaxial layer, wherein the first epitaxial layer includes a protruding portion that protrudes in the first direction and contacts the gate structure, wherein the protruding portion of the first epitaxial layer contacts at least a portion of a sidewall of the gate spacer in the second direction, and wherein the protruding portion of the first epitaxial layer has a (111) plane of a crystal.

According to example embodiments of the inventive concept, there is provided a method of manufacturing a semiconductor device, the method including: forming a fin structure on a substrate, the fin structure including sacrificial lines and semiconductor lines alternately and repeatedly stacked in a direction substantially perpendicular to an upper surface of the substrate; forming a dummy gate structure and a gate spacer on the substrate to partially cover the fin structure; performing a first etching process on the fin structure by using the dummy gate structure and the gate spacer as an etching mask to partially remove the fin structure so that a first opening is formed to expose the upper surface of the substrate; performing a second etching process on the sacrificial lines exposed by the first opening so that a sidewall of each of the sacrificial lines has a facet that is not a curved; performing a selective epitaxial growth (SEG) process using a sidewall of the fin structure and the upper surface of the substrate exposed by the first opening as a seed to form a source/drain layer containing silicon-germanium; removing the dummy gate structure and the sacrificial lines to form second and third openings, respectively; and forming a gate structure in the second and third openings.

In the semiconductor device according to example embodiments of the inventive concept, the source/drain layer may not be damaged while removing the sacrificial patterns.

The effects of the inventive concept are not limited thereto.

DETAILED DESCRIPTION OF THE EMBODIMENTS

A semiconductor device and a method of manufacturing the same in accordance with example embodiments of the inventive concept will be described more fully hereinafter with reference to the accompanying drawings. Herein, two directions among horizontal directions substantially parallel to an upper surface of a substrate, which may cross each other, may be referred to as first and second directions D1 and D2, respectively, and a vertical direction substantially perpendicular to the upper surface of the substrate may be referred to as a third direction 13. In example embodiments, the first and second directions D1 and D2 may be substantially perpendicular to each other.

Figure 1:
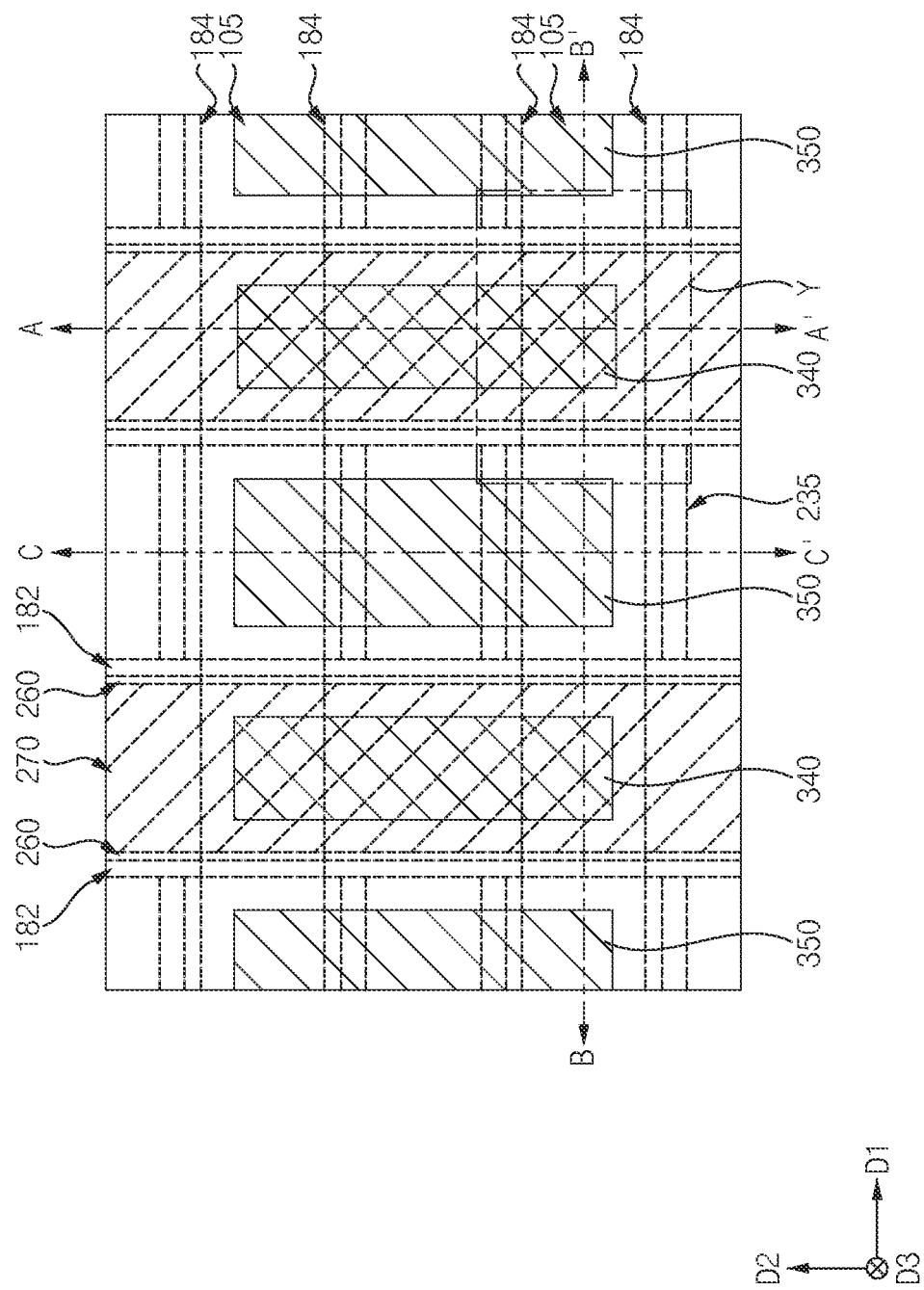
FIGS. 1, 2, 3, 4, 5 and 6 are a plan view and cross-sectional views illustrating a semiconductor device according to example embodiments of the inventive concept.
Figure 2:
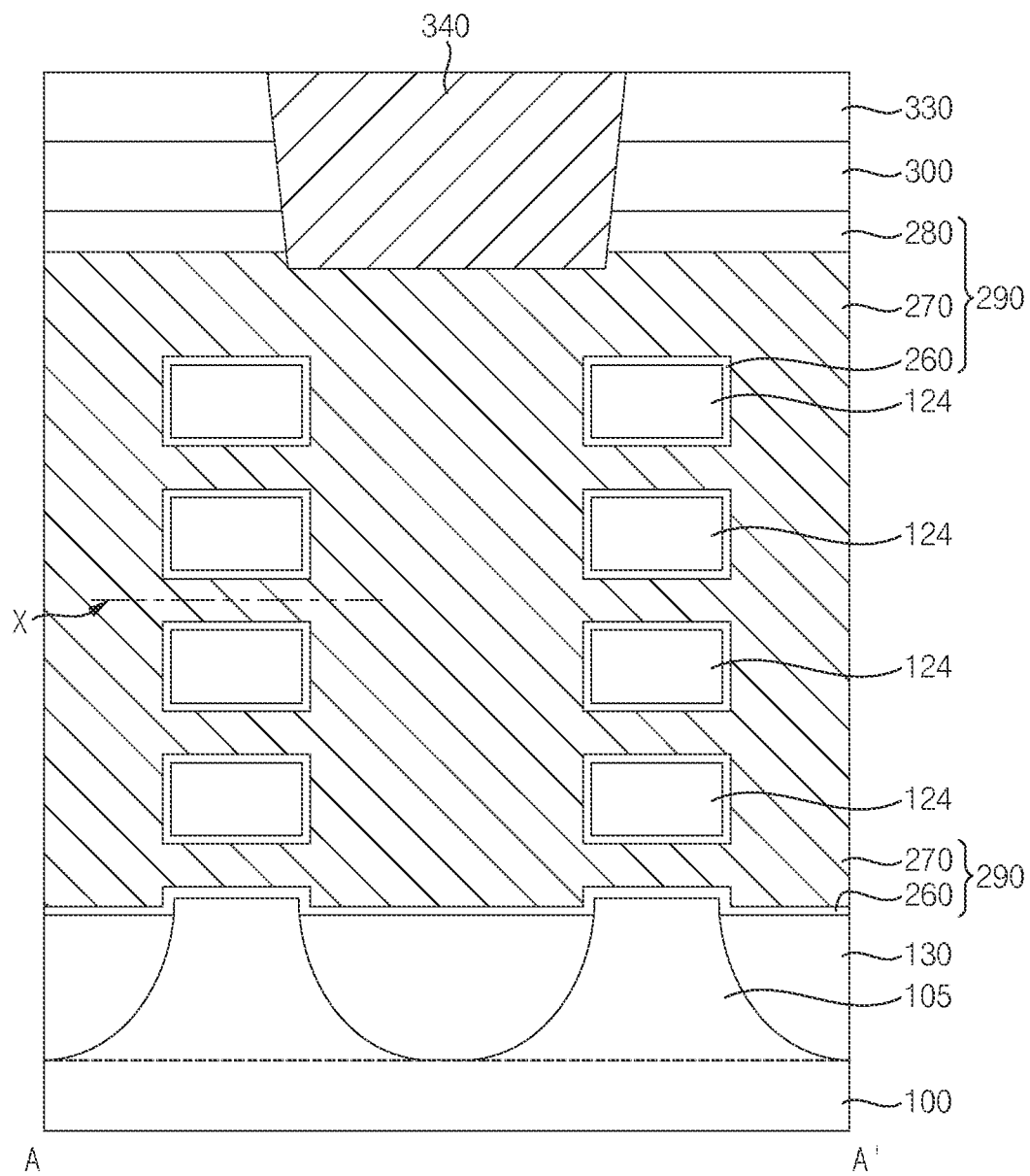
Figure 3:
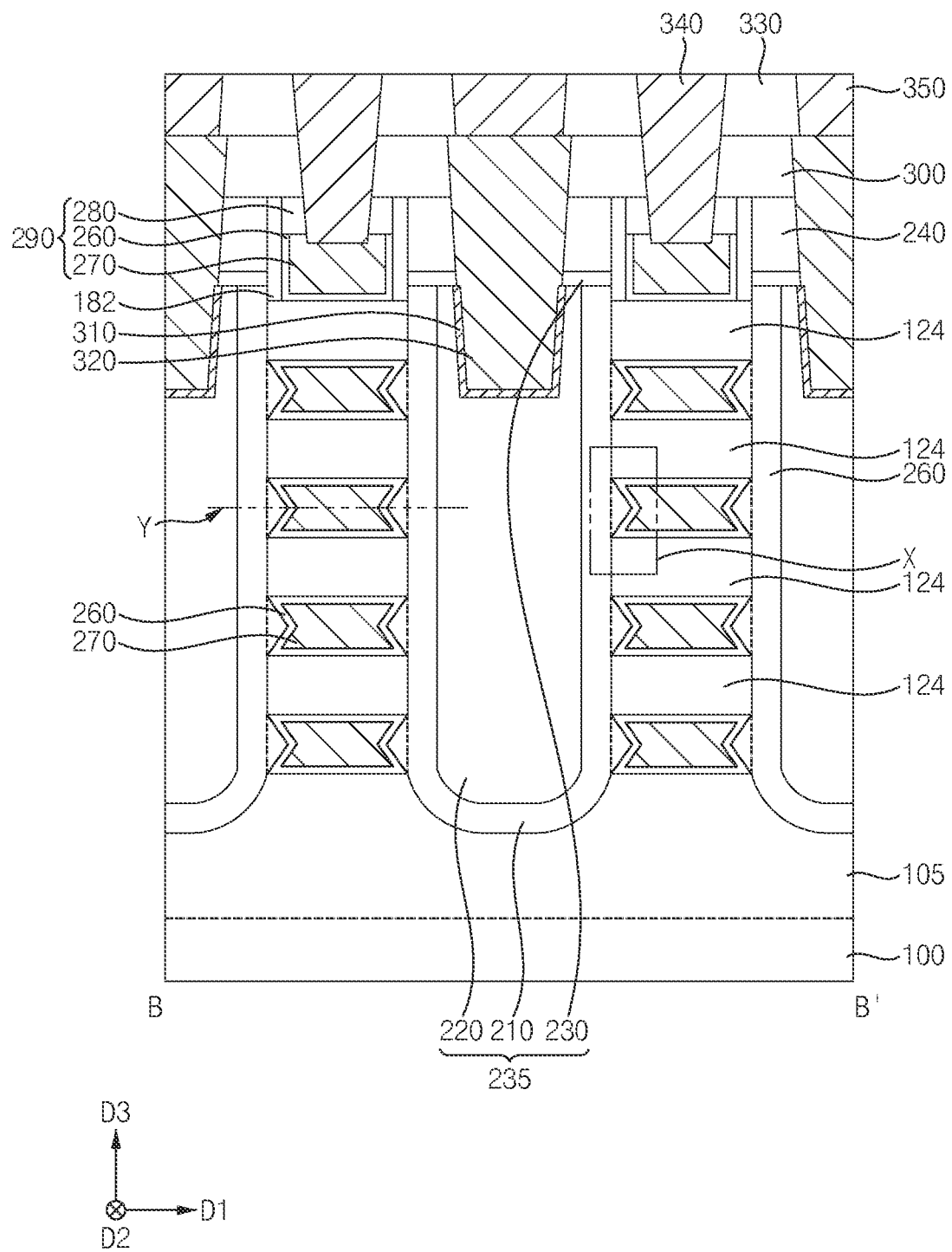
Figure 4:
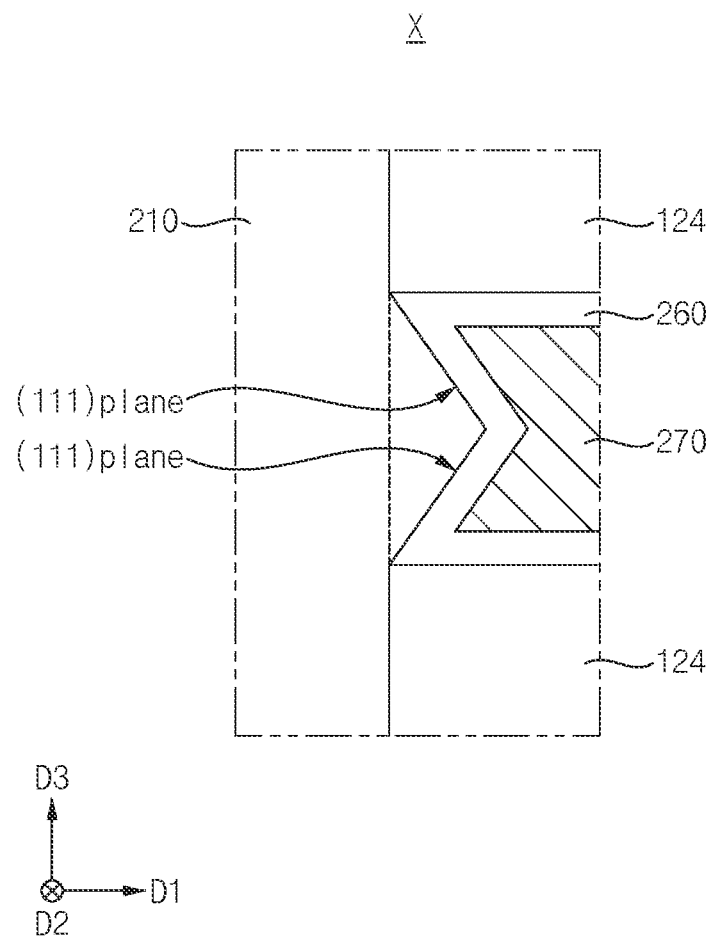
Figure 5:
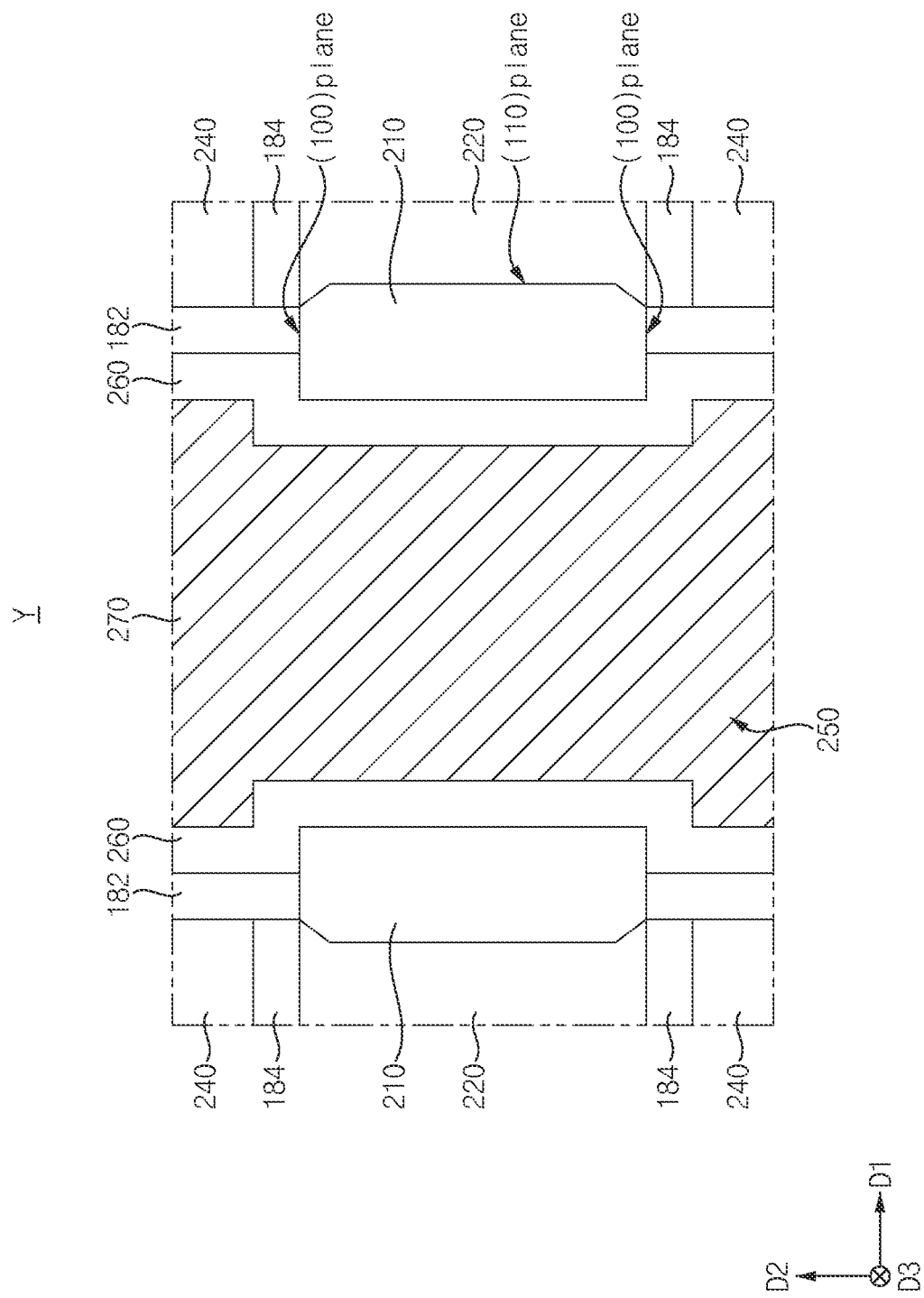
Figure 6:
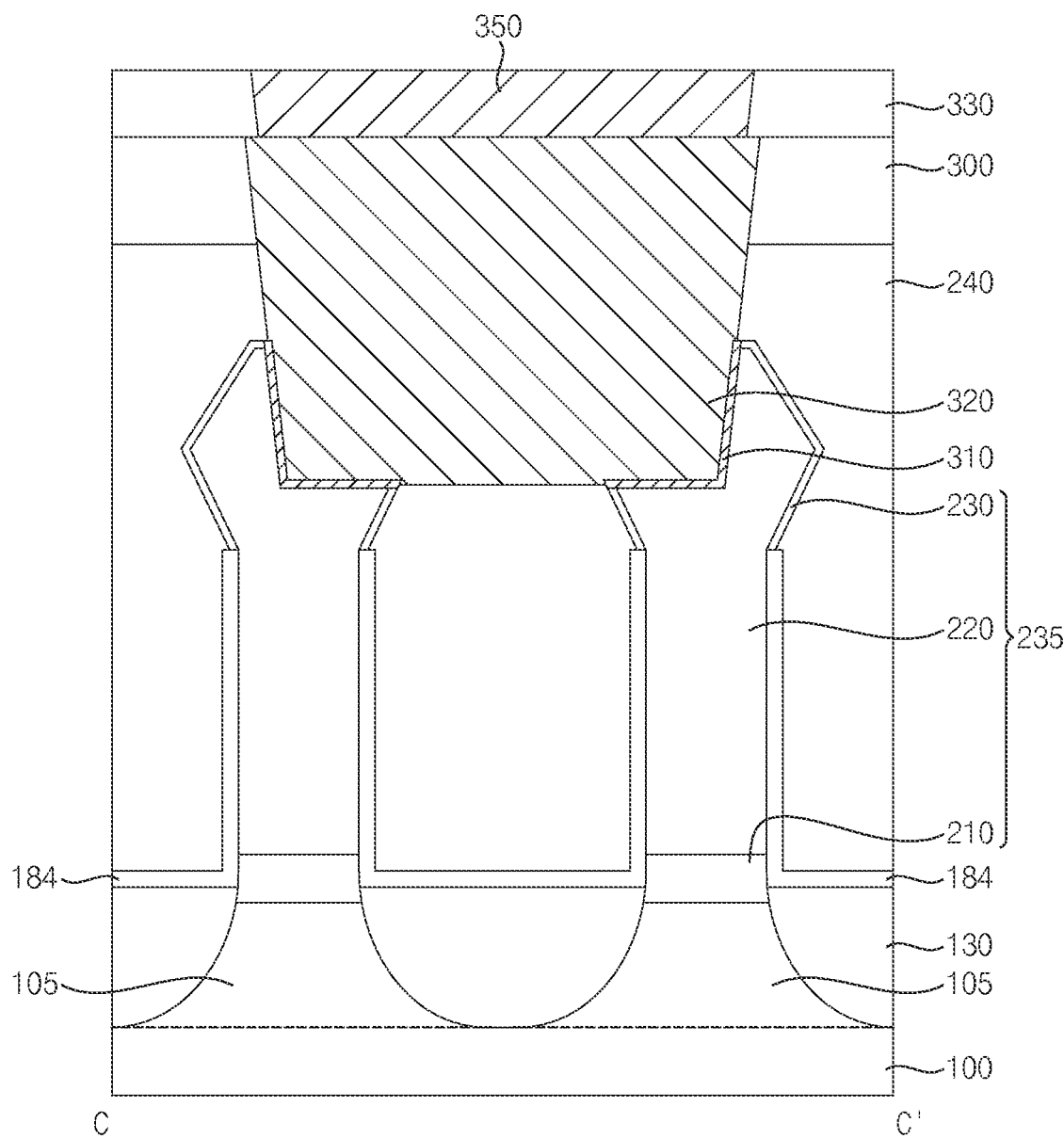

FIGS. 1 to 6 are a plan view and cross-sectional views illustrating a semiconductor device in accordance with example embodiments. FIG. 1 is the plan view, and FIGS. 2 to 5 are the cross-sectional views. FIG. 2 is a vertical cross-sectional view taken along a line A-A' of FIG. 1, FIG. 3 is a vertical cross-sectional view taken along a line B-B' of FIG. 1, and FIG. 6 is a vertical cross-sectional view taken along a line C-C' of FIG. 1. FIG. 4 is an enlarged vertical cross-sectional view of a region X of FIG. 3, and FIG. 5 is an enlarged horizontal cross-sectional view of a region Y of FIG. 1.

Referring to FIGS. 1 to 6, the semiconductor device may include an active pattern 105, an isolation pattern 130, a semiconductor pattern 124, a gate structure 290, a gate spacer 182, a source/drain fence 184, a source/drain layer 235 having first to third epitaxial layers 210, 220 and 230, first and second contact plugs 320 and 340, a via 350, and first to third insulating interlayers 240, 300 and 330 formed on a substrate 100.

The substrate 100 may include a semiconductor material, e.g., silicon, germanium, silicon-germanium, etc., or II-V semiconductor compounds, e.g., GaP, GaAs, GaSb, etc. In some embodiments, the substrate 100 may include a silicon-on-insulator (SOI) substrate or a germanium-on-insulator (GOI) substrate.

The active pattern 105 may protrude from an upper surface of the substrate 100, and a sidewall of the active pattern 105 may be covered by the isolation pattern 130. For example, the sidewall of the active pattern 105 may contact the isolation pattern 130. The active pattern 105 may extend in the first direction D1, and a plurality of active patterns 105 may be spaced apart from each other in the second direction D2. The active pattern 105 may include a material substantially the same as that of the substrate 100, and the isolation pattern 130 may include an oxide, e.g., silicon oxide.

The semiconductor patterns 124 may be formed at a plurality of levels, respectively, which are spaced apart from each other in the third direction D3, and each of the semiconductor patterns 124 may extend in the first direction D1 to a given length. FIGS. 2 and 3 show that the semiconductor patterns 124 are formed at four levels, respectively, however, the inventive concept may not be limited thereto.

FIG. 3 shows that two semiconductor patterns 124 are spaced apart from each other at each level on the active pattern 105 extending in the first direction D1. For example, two semiconductor patterns 124 at the same level may be spaced apart from each other by the source/drain layer 235. It is to be understood, however, that the inventive concept may not be limited thereto, and a plurality of semiconductor patterns 124 may be spaced apart from each other at each level on the active pattern 105.

In example embodiments, the semiconductor pattern 124 may be a nano-sheet or nano-wire including a semiconductor material, e.g., silicon, germanium, etc. In example embodiments, the semiconductor pattern 124 may function as a channel in a transistor, and thus may also be referred to as a channel.

The gate structure 290 may extend in the second direction D2 on the active pattern 105 and the isolation pattern 130, and may include a gate insulation pattern 260, a gate electrode 270 and a capping pattern 280.

In example embodiments, the gate structure 290 may surround a central portion in the first direction D1 of each of the semiconductor patterns 124, and may cover lower and upper surfaces and opposite sidewalls in the second direction D2 of the central portion of each of the semiconductor patterns 124. As an example, in FIG. 3, the gate structure 290 may be formed on upper and lower surfaces of the semiconductor patterns 124.

In example embodiments, the gate insulation pattern 260 may be formed on a surface of each of the semiconductor patterns 124, an upper surface of the active pattern 105, an upper surface of the isolation pattern 130, a sidewall of the first epitaxial layer 210 and an inner sidewall of the gate spacer 182. The gate electrode 270 may fill a space between the semiconductor patterns 124 spaced apart from each other in the third direction D3, a space between the active pattern 105 and a lowermost one of the semiconductor patterns 124, and a space between the gate spacers 182 spaced apart from each other in the first direction D1 on an uppermost one of the semiconductor patterns 124.

Hereinafter, a portion of the gate structure 290 on the uppermost one of the semiconductor patterns 124 may be referred to as an upper portion of the gate structure 290, and other portions of the gate structure 290 under the upper portion may be referred to as a lower portion of the gate structure 290.

The gate insulation pattern 260 may include an oxide, e.g., silicon oxide. The gate electrode 270 may include a metal nitride, e.g., titanium nitride, titanium aluminum nitride, tantalum nitride, tantalum aluminum nitride, etc., a metal alloy, e.g., titanium aluminum, titanium aluminum carbide, titanium aluminum oxynitride, titanium aluminum carbonitride, titanium aluminum oxycarbonitride, etc., a metal carbide, a metal oxynitride, a metal carbonitride, a metal oxycarbonitride, or a low resistance metal, e.g., tungsten, aluminum, copper, tantalum.

The gate spacer 182 may be formed on each of opposite sidewalls in the first direction D1 of the gate structure 290.

The capping pattern 280 may contact upper surfaces of the gate insulation pattern 260 and the gate electrode 270, and the inner sidewall of the gate spacer 182.

Each of the gate spacer 182 and the capping pattern 280 may include an insulating nitride, e.g., silicon nitride.

The source/drain layer 235 may be formed on a portion of the active pattern 105 adjacent to the gate structure 290, and may include the first to third epitaxial layers 210, 220 and 230 sequentially stacked in the third direction D3. For example, the source/drain layer 235 may be formed between adjacent protruding portions of the active pattern 105.

The first epitaxial layer 210 may commonly contact each of opposite sidewalls in the first direction D1 of the semiconductor patterns 124. An upper portion of the first epitaxial layer 210 may partially contact an outer sidewall of the gate spacer 182.

The first epitaxial layer 210 may contact each of opposite sidewalls in the first direction D1 of the lower portion of the gate structure 290. In example embodiments, a sidewall of a portion of the first epitaxial layer 210 facing the gate structure 290 in the first direction D1 (hereinafter, referred to as a first portion) may protrude more in the first direction D1 when compared to a sidewall of a portion of the first epitaxial layer 210 facing the semiconductor pattern 124 in the first direction D1 (hereinafter, referred to as a second portion). A portion of the first portion of the first epitaxial layer 210 protruding towards the gate structure 290 in the first direction D1 may be referred to as a protruding portion. The lower portion of the gate structure 290 may be formed between the semiconductor patterns 124 spaced apart from each other in the third direction D3, and correspondingly, a plurality of protruding portions of the first epitaxial layer 210 may be spaced apart from each other in the third direction D3.

In example embodiments, a cross-section in the first direction D1 of the protruding portion of the first epitaxial layer 210 may have a shape of a triangle. In an example embodiment, a surface of the protruding portion of the first epitaxial layer 210 facing the gate structure 290 may have the (111) plane of a crystal.

At a height of the protruding portion of the first epitaxial layer 210, each of opposite sidewalls in the first direction D1 of the gate structure 290 may have a concave shape corresponding to the convex shape of the protruding portion of the first epitaxial layer 210. In addition, sidewalls of an upper portion and a lower portion of the protruding portion of the first epitaxial layer 210 may have constant slopes, respectively, having opposite directions from each other.

In example embodiments, the protruding portion of the first epitaxial layer 210 may at least partially contact a sidewall of the gate spacer 182 in the second direction D2.

In example embodiments, a horizontal cross-section of the first portion of the first epitaxial layer 210 may have a shape of a hexagon. In an example embodiment, the first portion of the first epitaxial layer 210 may have the (100) plane of a crystal and the (110) plane of a crystal.

The second epitaxial layer 220 may be formed on the first epitaxial layer 210, and the third epitaxial layer 230 may cover upper surfaces of the first and second epitaxial layers 210 and 220.

Each of the first and second epitaxial layers 210 and 220 may include single crystalline silicon-germanium doped with p-type impurities. A germanium concentration of the second epitaxial layer 220 may be greater than that of the first epitaxial layer 210. The third epitaxial layer 230 may include single crystalline silicon.

The source/drain fence 184 may cover the upper surface of the isolation pattern 130, each of opposite sidewalls in the second direction D2 of the first epitaxial layer 210, and a lower portion of each of opposite sidewalls in the second direction D2 of the second epitaxial layer 220.

The source/drain fence 184 may include an insulating nitride, e.g., silicon nitride.

The first insulating interlayer 240 may be formed on the substrate 100, and may cover an upper surface and an outer sidewall of the source/drain fence 184, an upper surface of the third epitaxial layer 230 and the outer sidewall of the gate spacer 182. The second insulating interlayer 300 may be formed on the first insulating interlayer 240, the capping pattern 280 and the gate spacer 182. The third insulating interlayer 330 may be formed on the second insulating interlayer 300 and the first contact plug 320.

Each of the first to third insulating interlayers 240, 300 and 330 may include an insulating material, e.g., silicon oxycarbide (SiOC), silicon oxide (SiO$_2$), silicon nitride (SiN), silicon oxynitride (SiON), silicon carbonitride (SiCN), silicon oxycarbonitride (SiOCN), etc.

The first contact plug 320 may extend through the first and second insulating interlayers 240 and 300 and an upper portion of the source/drain layer 235 to be electrically connected thereto. An ohmic contact pattern 310 may be formed between the first contact plug 320 and the source/drain layer 235. The first contact plug 320 may contact the source/drain layer 235 between adjacent portions of the ohmic contact pattern 310.

The second contact plug 340 may extend through the second and third insulating interlayers 300 and 330 and the capping pattern 280 to contact the gate electrode 270. The via 350 may extend through the third insulating interlayer 330 to contact the first contact plug 320.

Each of the first and second contact plugs 320 and 340 and the via 350 may include, e.g., a metal, a metal nitride, etc., and the ohmic contact pattern 310 may include a metal silicide, e.g., cobalt silicide, nickel silicide, titanium silicide, etc.

Upper wirings may be formed on the second contact plug 340 and the via 350 to apply electric signals thereto.

The semiconductor device may be a multi-bridge channel field effect transistor (MBCFET) including the semiconductor patterns 124 spaced apart from each other in the third direction D3 and serving as channels, respectively.

In the semiconductor device, the second epitaxial layer 220 may be entirely covered by the first epitaxial layer 210, and thus, as described below, during an etching process to replace a dummy gate structure 170 (refer to FIGS. 9 to 11) with the gate structure 290, the second epitaxial layer 220 may be protected by the first epitaxial layer 210, and may not be damaged.

FIGS. 7 to 33 are plan views and cross-sectional views illustrating a method of manufacturing a semiconductor device in accordance with example embodiments. Particularly, FIGS. 7, 9, 12, 26 and 31 are the plan views, FIGS. 8, 10-11, 13-14, 16-18, 20, 22-23, 25, 27-29 and 32-33 are vertical cross-sectional views, and FIGS. 15, 19, 21, 24 and 30 are horizontal cross-sectional views.

Figure 8:
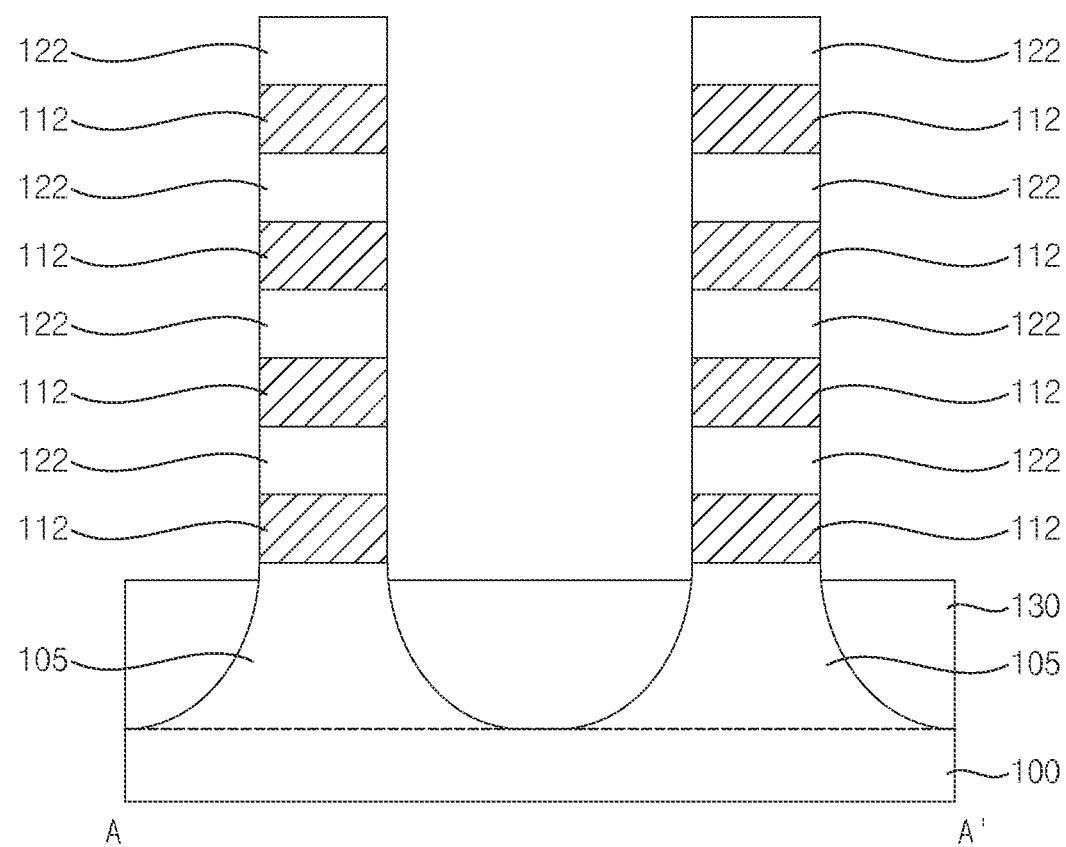
Figure 8:
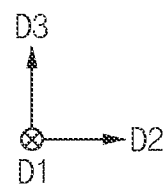
Figure 10:
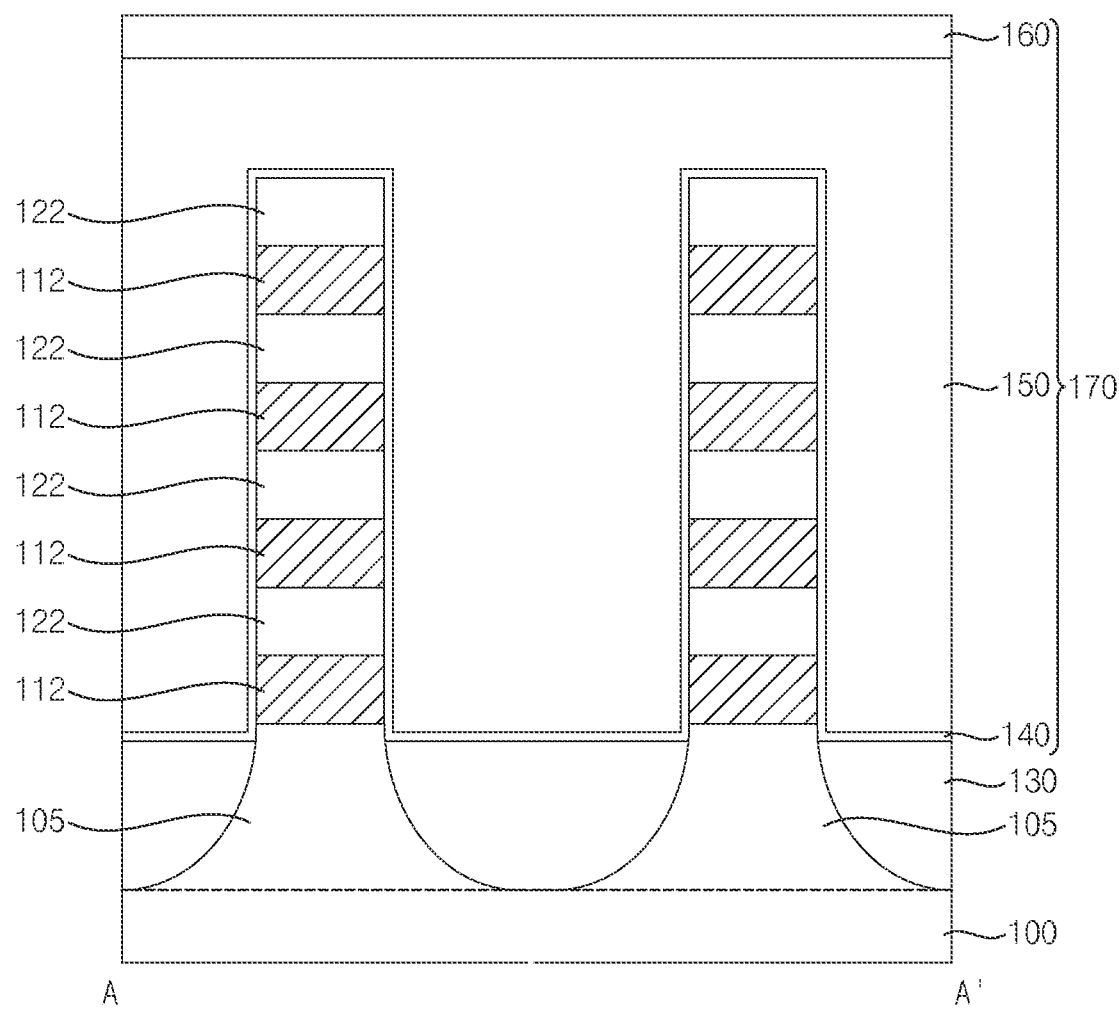
Figure 14:
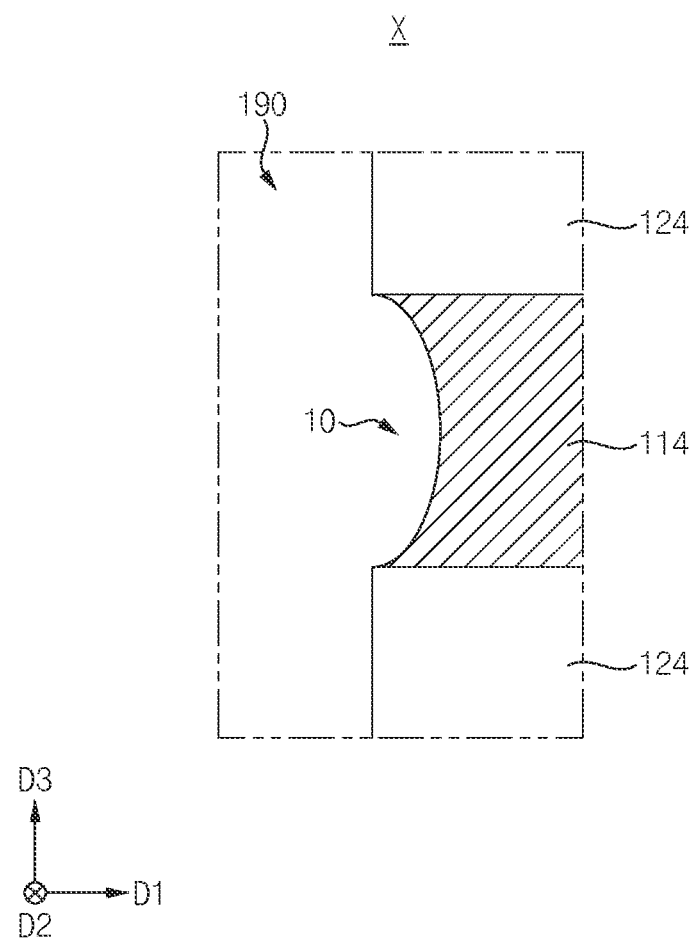
Figure 15:
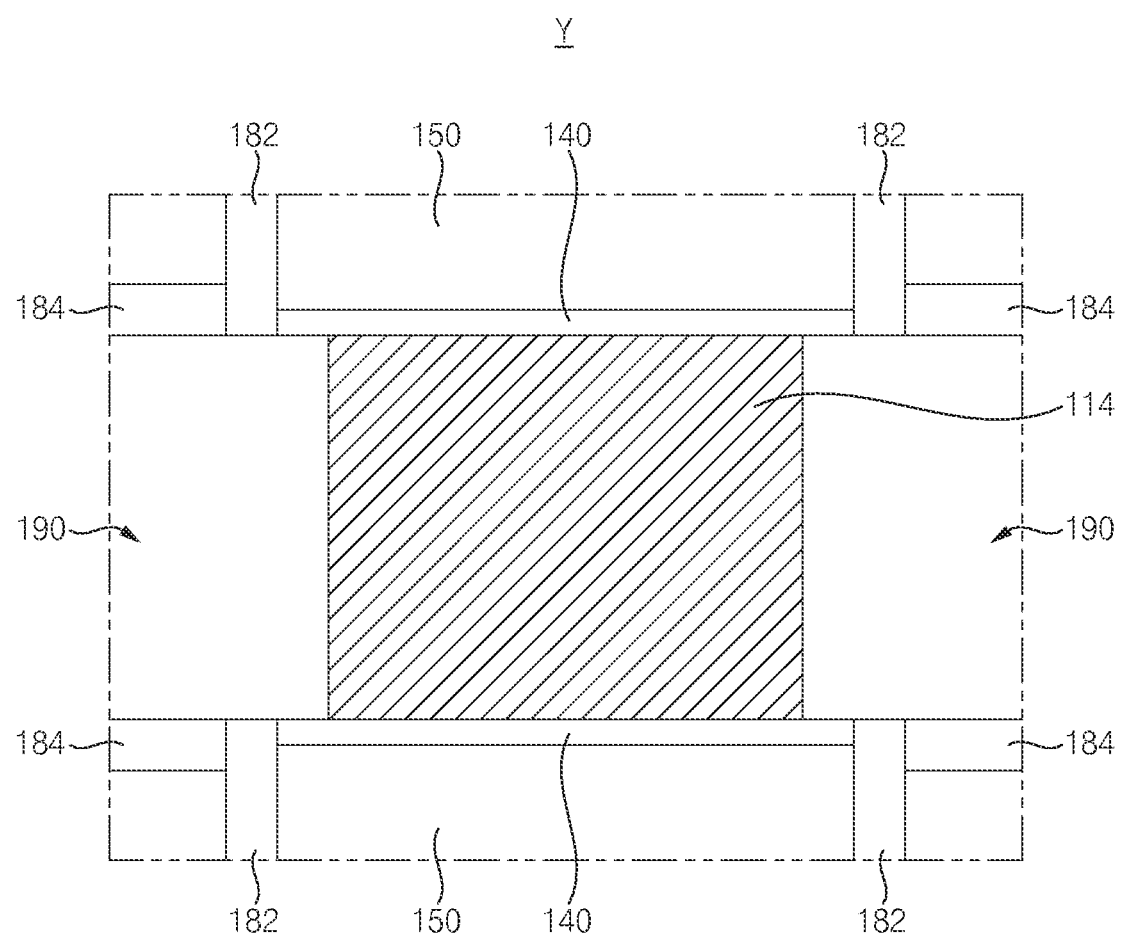
Figure 16:
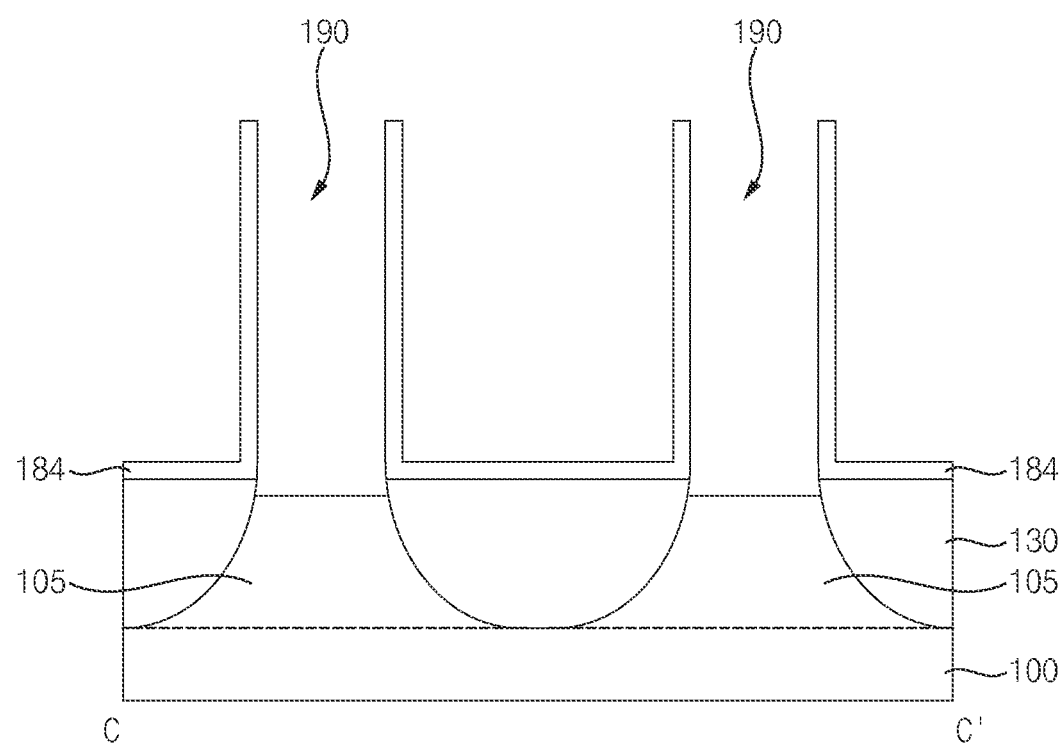
Figure 32:
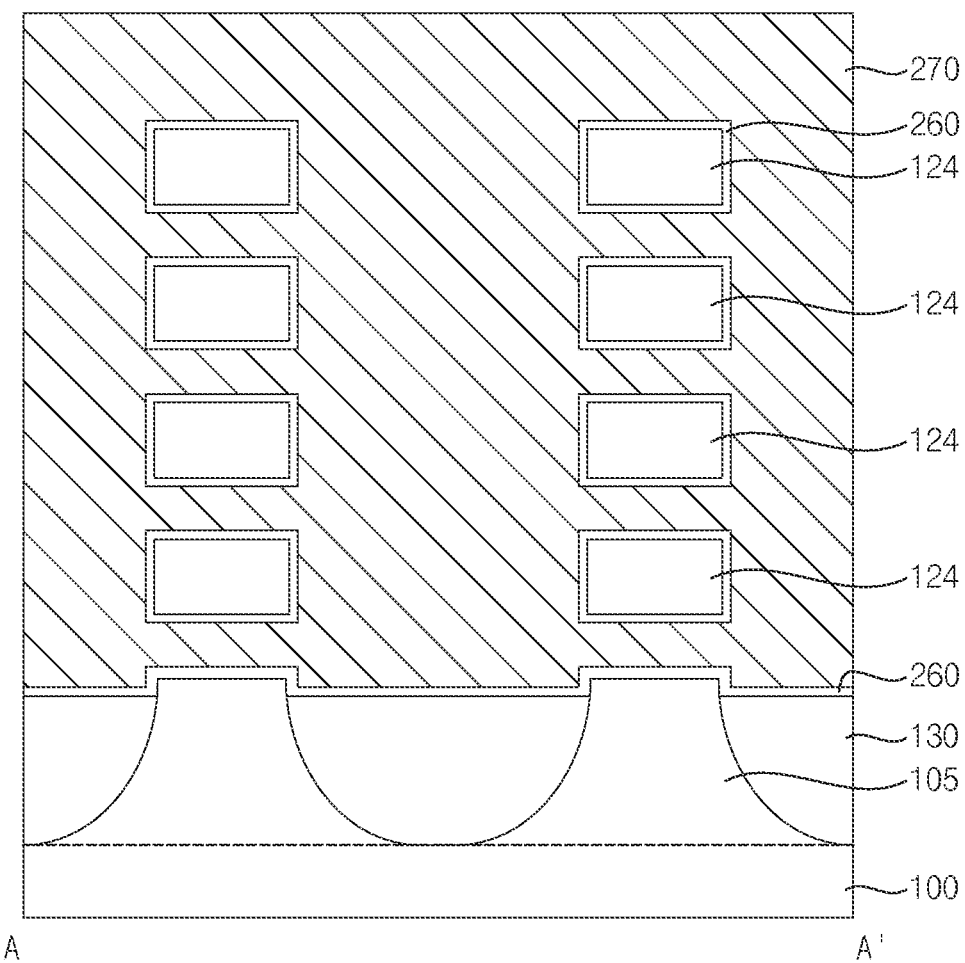
Figure 32:
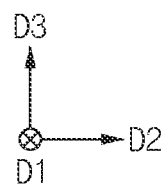

FIGS. 8, 10 and 32 are cross-sectional views taken along lines A-A' of corresponding plan views, respectively, FIGS. 11, 13, 17, 20, 23, 27, 29 and 33 are cross-sectional views taken along lines B-B' of corresponding plan views, respectively, and FIGS. 16, 22, 25 and 28 are cross-sectional views taken along line C-C' of corresponding plan views, respectively. FIGS. 14 and 18 are enlarged vertical cross-sectional views of region X of corresponding plan views, respectively, and FIGS. 15, 19, 21, 24 and 30 are enlarged horizontal cross-sectional views of region Y of corresponding plan views, respectively.

Figure 7:
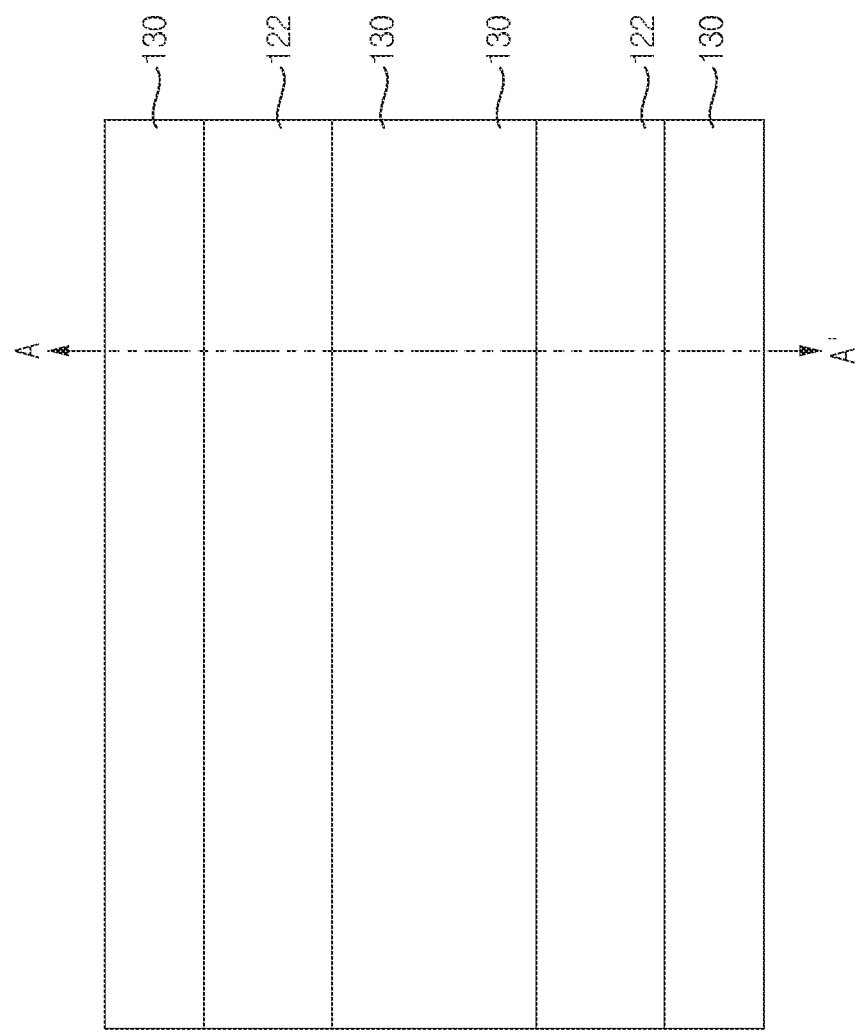
FIGS. 7, 8, 9, 10, 11, 12, 13, 14, 15, 16, 17, 18, 19, 20, 21, 22, 23, 24, 25, 26, 27, 28, 29, 30, 31, 32 and 33 are plan views and cross-sectional views illustrating a method of manufacturing a semiconductor device according to example embodiments of the inventive concept.
Figure 7:
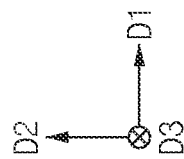

Referring to FIGS. 7 to 8, a sacrificial layer and a semiconductor layer may be alternately and repeatedly stacked on a substrate 100, a first etching mask extending in the first direction D1 may be formed on an uppermost one of the semiconductor layers, and the semiconductor layers, the sacrificial layers and an upper portion of the substrate 100 may be etched using the first etching mask.

Thus, an active pattern 105 extending in the first direction D1 may be formed on the substrate 100, and a fin structure including sacrificial lines 112 and semiconductor lines 122 alternately and repeatedly stacked in the third direction D3 may be formed on the active pattern 105. In example embodiments, the fin structure may extend in the first direction D1 on the substrate 100, and a plurality of fin structures may be spaced apart from each other in the second direction D2 on the substrate 100.

FIG. 8 shows four sacrificial lines 112 and four semiconductor lines 122 at four levels, respectively, however, the inventive concept may not be limited thereto. The semiconductor lines 122 may include, e.g., silicon, and the sacrificial lines 112 may include a material having an etching selectivity with respect to the substrate 100 and the semiconductor lines 122, e.g. silicon-germanium.

An isolation pattern 130 may be formed on the substrate 100 to cover a sidewall of the active pattern 105. The isolation pattern 130 may entirely cover the sidewall of the active pattern 105, or the isolation pattern 130 may only cover a lower portion of the sidewall of the active pattern 105 to partially expose an upper portion thereof.

Figure 9:
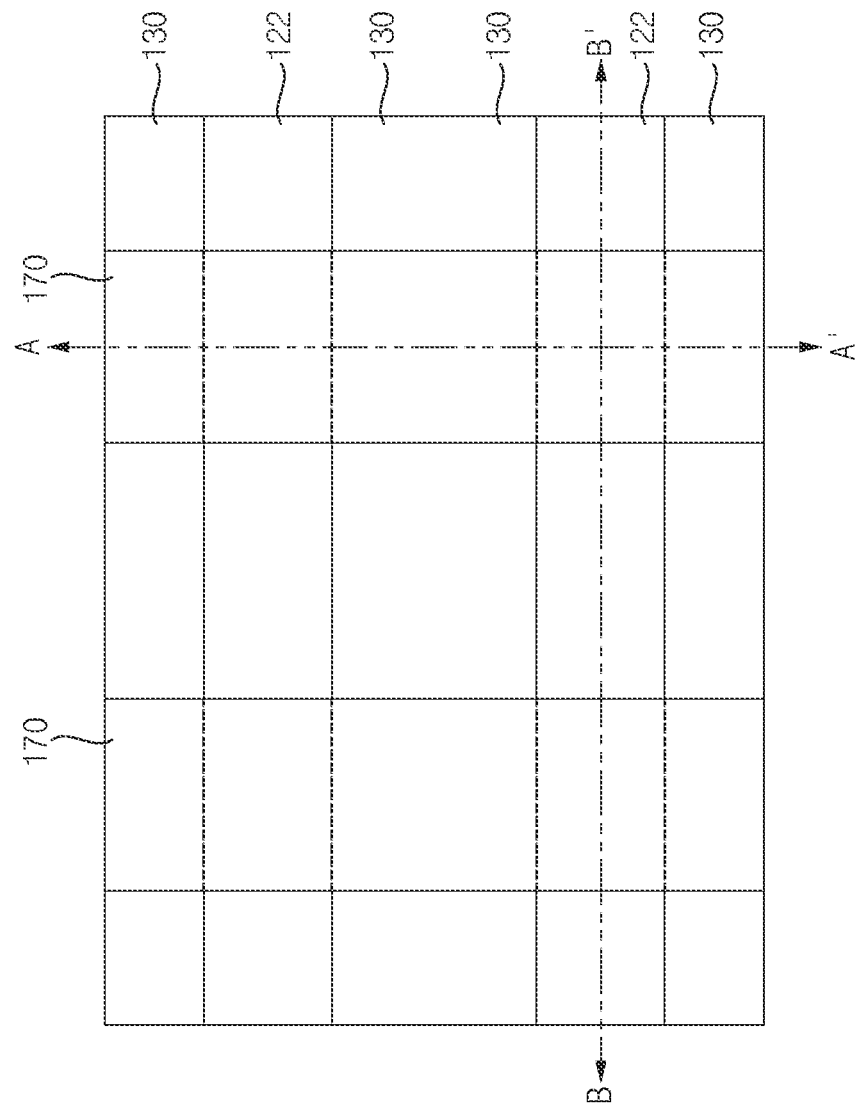
Figure 9:
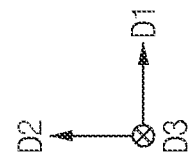
Figure 11:
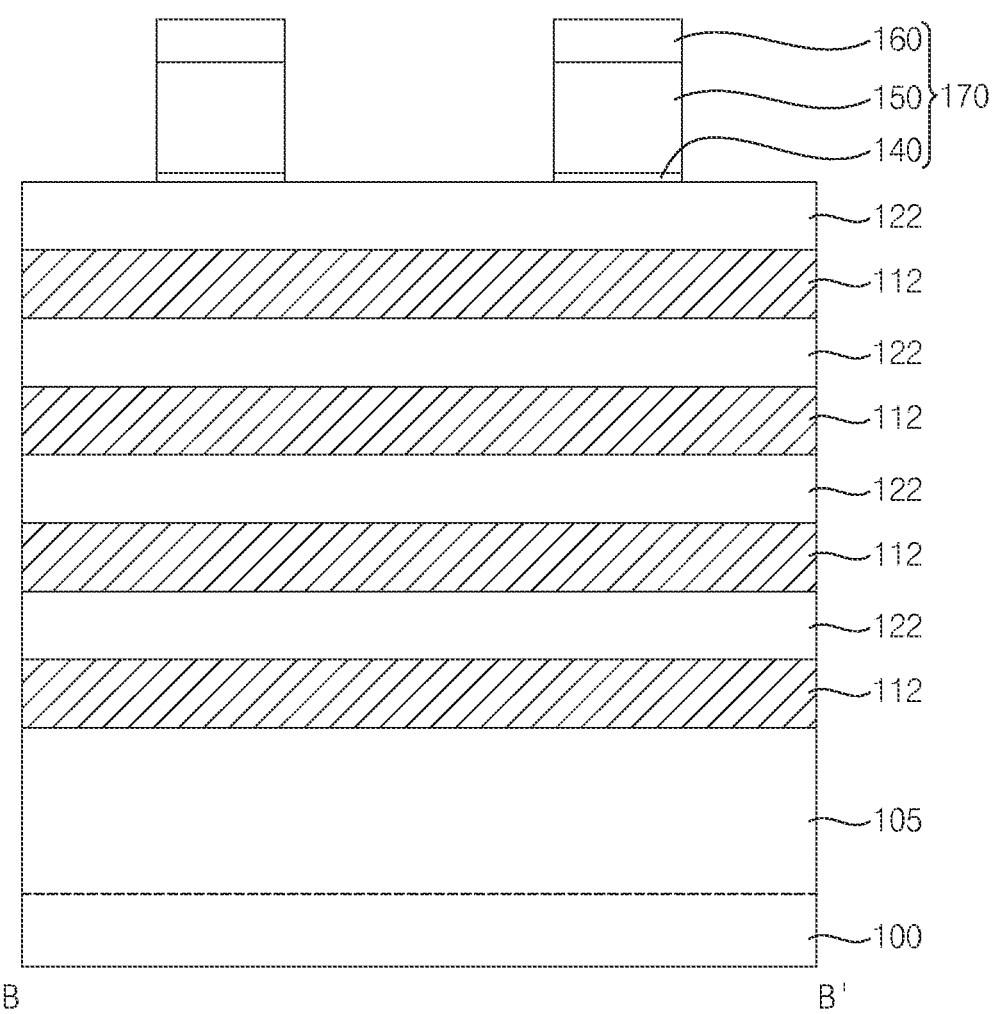
Figure 12:
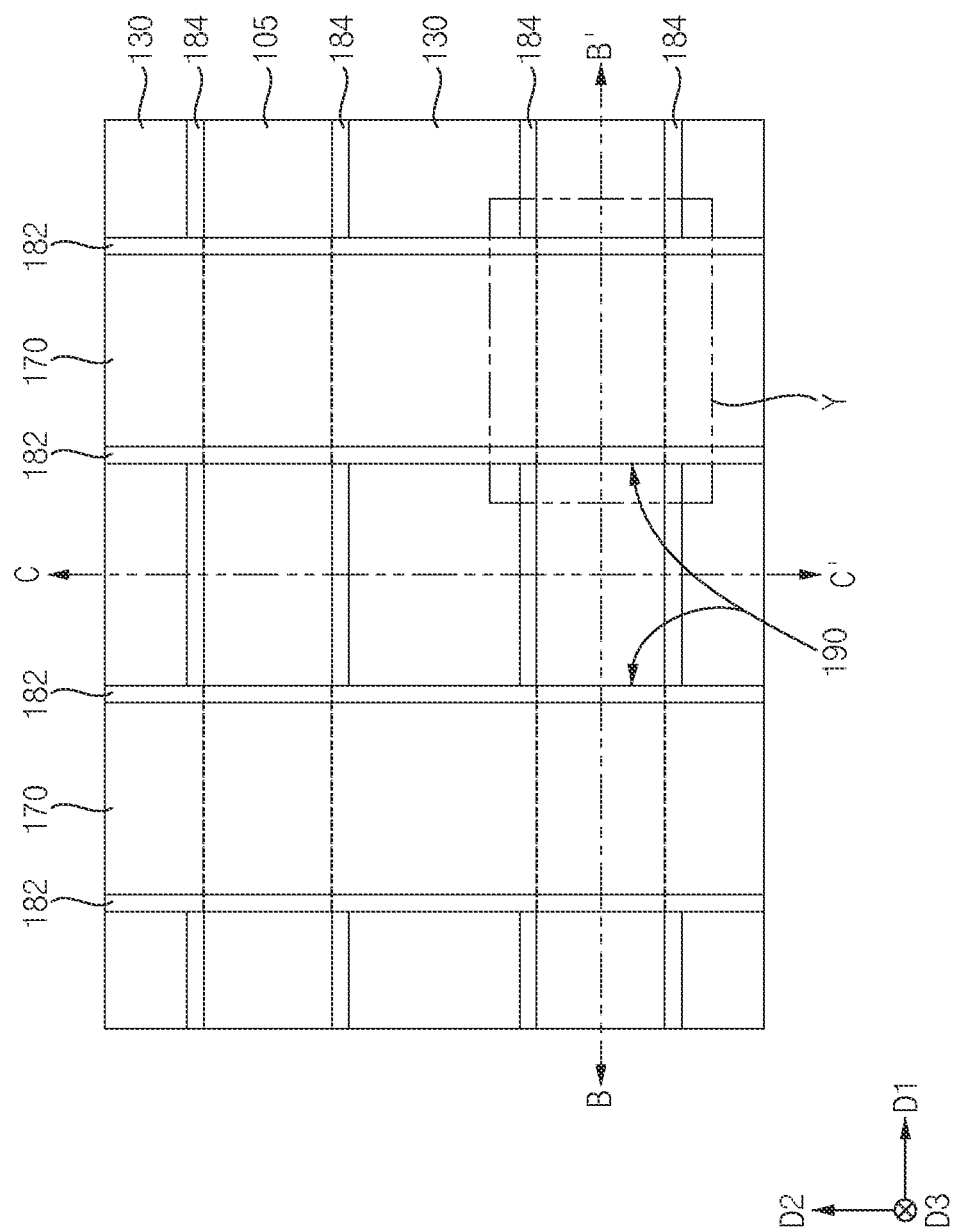
Figure 13:
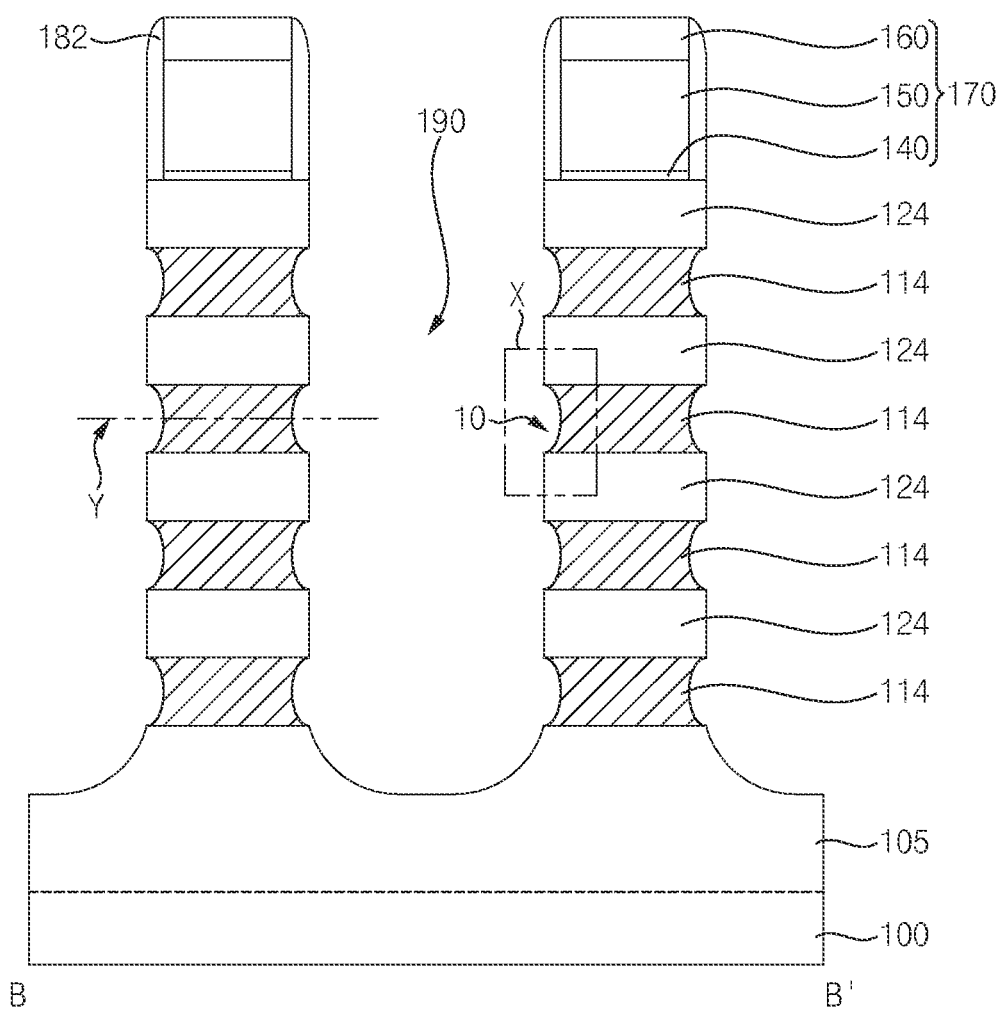
Figure 13:
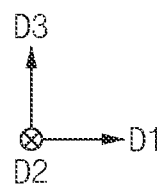

Referring to FIGS. 9 to 11, a dummy gate structure 170 may be formed on the substrate 100 to partially cover the fin structure and the isolation pattern 130.

Particularly, a dummy gate insulation layer, a dummy gate electrode layer and a dummy gate mask layer may be sequentially formed on the active pattern 105, the fin structures and the isolation pattern 130, a second etching mask extending in the second direction D2 may be formed on the dummy gate mask layer, and the dummy gate mask layer may be etched using the second etching mask to form a dummy gate mask 160.

The dummy gate electrode layer and the dummy gate insulation layer may be etched using the dummy gate mask 160 as an etching mask to form a dummy gate electrode 150 and a dummy gate insulation pattern 140, respectively.

The dummy gate insulation pattern 140, the dummy gate electrode 150 and the dummy gate mask 160 sequentially stacked in the third direction D3 on the active pattern 105 and a portion of the isolation pattern 130 adjacent thereto may form the dummy gate structure 170. In example embodiments, the dummy gate structure 170 may extend in the second direction D2 on the fin structure and the isolation pattern 130, and may cover an upper surface and opposite sidewalls in the second direction D2 of the fin structure.

In example embodiments, a plurality of dummy gate structures 170 may be spaced part from each other in the first direction D1. FIGS. 9 to 11 shows two dummy gate structures 170 spaced apart from each other in the first direction D1, however, the inventive concept may not be limited thereto.

Referring to FIGS. 12 to 16, a spacer layer may be formed on the dummy gate structure 170, the isolation pattern 130 and the active pattern 105.

In example embodiments, the spacer layer may include a nitride, e.g., silicon oxycarbonitride (SiOCN), silicon oxynitride (SiON), silicon carbonitride (SiCN), silicon nitride (SiN), etc.

The spacer layer may be anisotropically etched to form a gate spacer 182 on each of opposite sidewalls in the first direction D1 of the dummy gate structure 170.

A source/drain fence 184 may be formed on each of opposite sidewalls in the second direction D2 of the fin structure which are not covered by the dummy gate structure 170 and a portion of the isolation pattern 130 adjacent thereto.

The fin structure and an upper portion of the active pattern may be etched using the dummy gate structure 170 and the gate spacer 182 as an etching mask to form a first opening 190.

Thus, the sacrificial lines 112 and the semiconductor lines 122 under the dummy gate structure 170 and the gate spacers 182 may be transformed into preliminary sacrificial patterns 114 and semiconductor patterns 124, respectively, and the fin structure extending in the first direction D1 may be divided into a plurality of parts spaced apart from each other in the first direction D1.

During the etching process, the sacrificial lines 112, which may include a material different from that of the semiconductor lines 122, may be etched more than the semiconductor lines 122. Accordingly, each of opposite sidewalls in the first direction D1 of the preliminary sacrificial pattern 114 may not be perpendicular to the upper surface of the substrate 100. For example, each of the opposite sidewalls in the first direction D1 of the preliminary sacrificial pattern 114 may be concave and form a first recess 10. Thus, a width in the first direction D1 of a central portion in the third direction D3 of the preliminary sacrificial pattern 114 may be smaller than widths of upper and lower portions in the third direction D3 of the preliminary sacrificial pattern 114.

Hence, at a height of the central portion in the third direction D3 of the preliminary sacrificial pattern 114, a sidewall in the second direction D2 of each of edge portions in the first direction D1 of the dummy gate insulation pattern 140 included in the dummy gate structure 170 and a sidewall in second direction D2 of the gate spacer 182 may not be covered by the preliminary sacrificial pattern 114, but may be exposed.

Hereinafter, the dummy gate structure 170, the gate spacers 182 on the opposite sidewalls, respectively, of the dummy gate structure 170, and the fin structure may be referred to as a stack structure. In example embodiments, the stack structure may extend in the second direction D2, and a plurality of stack structures may be spaced apart from each other in the first direction D1.

Figure 17:
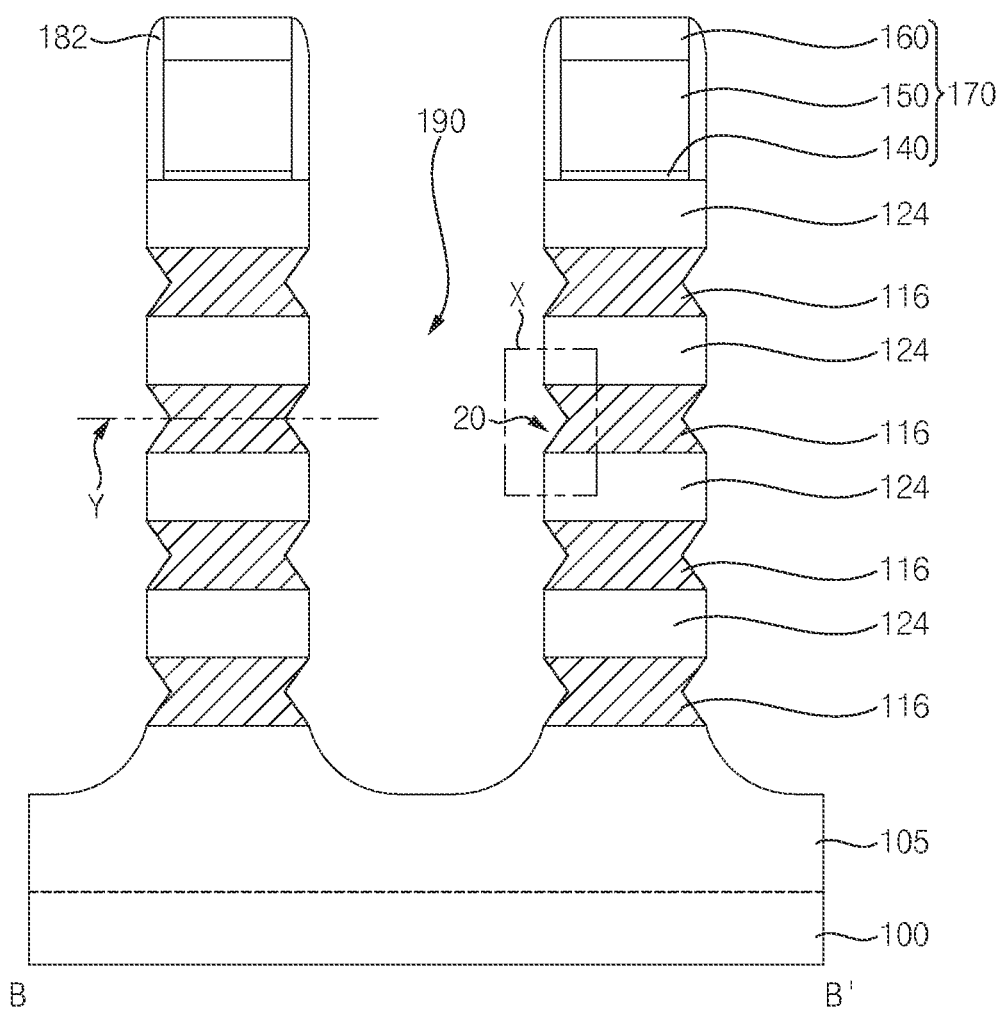
Figure 18:
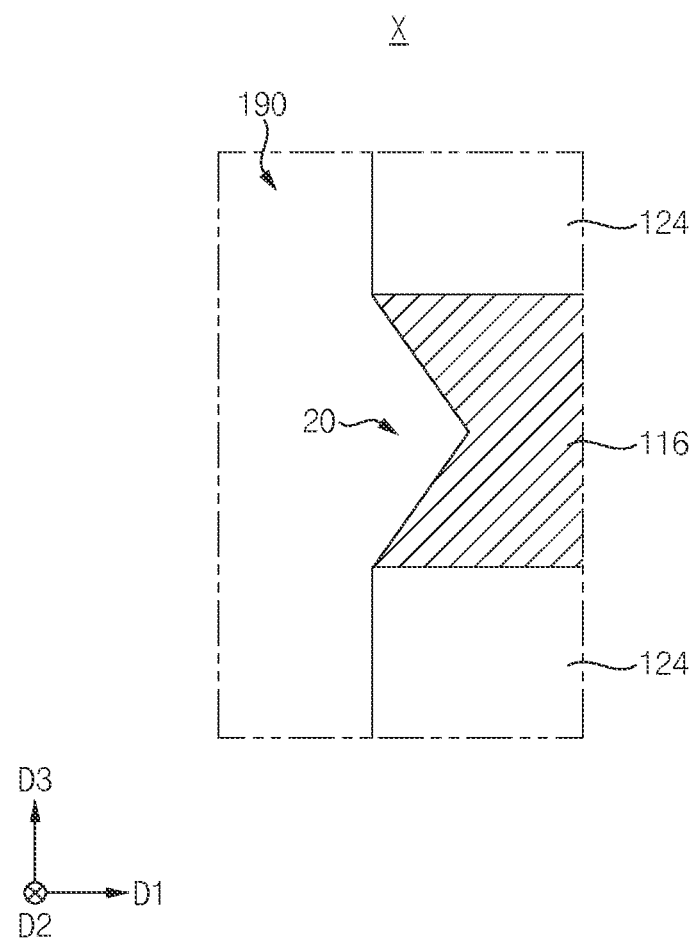
Figure 19:
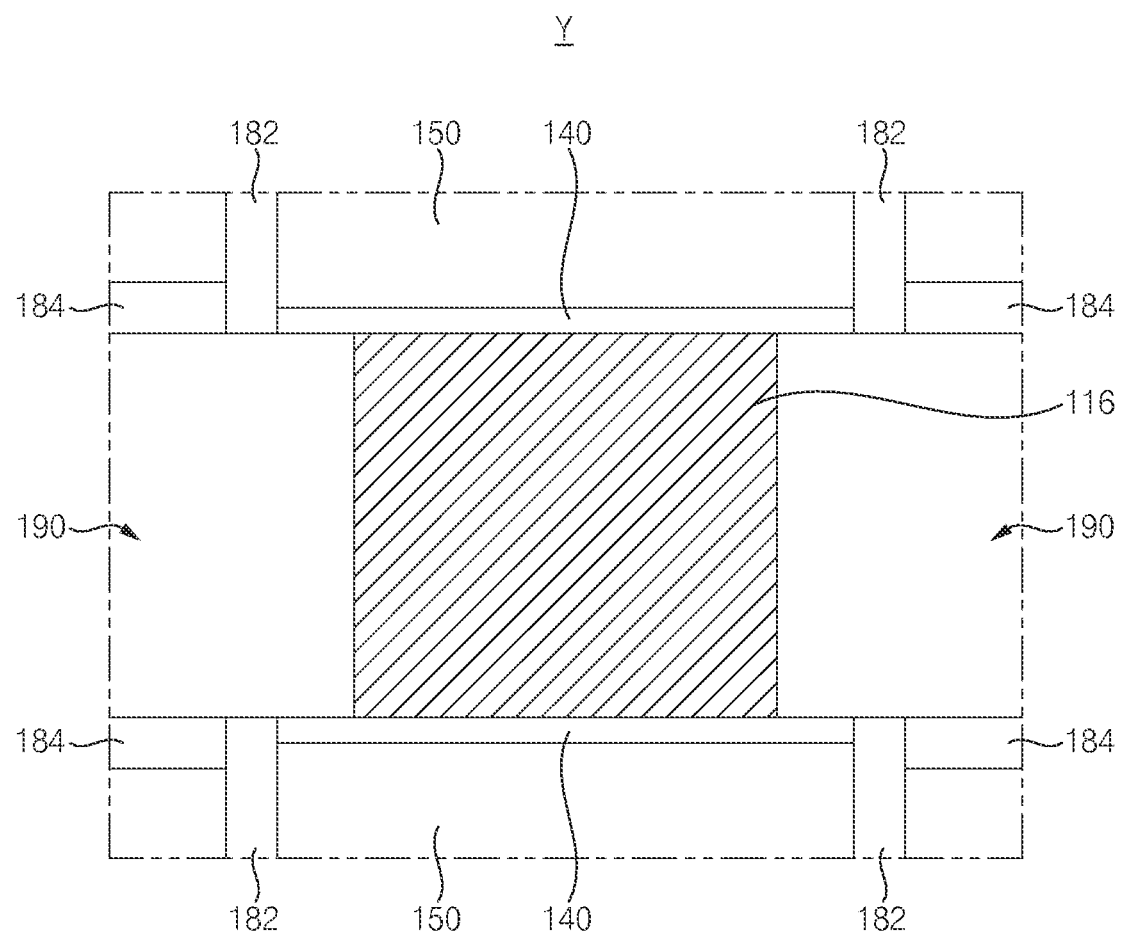

Referring to FIGS. 17 to 19, a wet etching process using an etchant, e.g., ammonium hydroxide (NH$_4$OH), may be performed to etch a surface of the preliminary sacrificial pattern 114, and the preliminary sacrificial pattern 114 may be transformed into a sacrificial pattern 116.

The wet etching process may have different etching rates according to the direction of the surface of the preliminary sacrificial pattern 114 to be etched, and accordingly, facets may be formed on each of opposite sidewalls in the first direction D1 of the sacrificial pattern 116. In example embodiments, each of the opposite sidewalls in the first direction D1 of the sacrificial pattern 116 may have a shape of "V" or a sigma. In other words, each of the opposite sidewalls in the first direction D1 of the sacrificial pattern 116 may be triangular. Accordingly, a second recess 20 having a shape of "V" may be formed on each of the opposite sidewalls in the first direction D1 of the sacrificial pattern 116. In other words, the second recess 20 may be triangular.

In an example embodiment, each of the opposite sidewalls in the first direction D1 of the sacrificial pattern 116 may include the (111) plane of a crystal. However, the inventive concept may not be limited thereto, and depending on the type of the etchant used in the wet etching process, each of the opposite sidewalls in the first direction D1 of the sacrificial pattern 116 may include a crystal plane of another direction. Furthermore, each of the opposite sidewalls of the sacrificial pattern 116 may include a non-curved surface, in other words, a facet.

If necessary, the wet etching process on the preliminary sacrificial pattern 114 may be performed more than once.

A cleaning process may be further performed on the substrate 100 on which the stack structure is formed.

Figure 20:
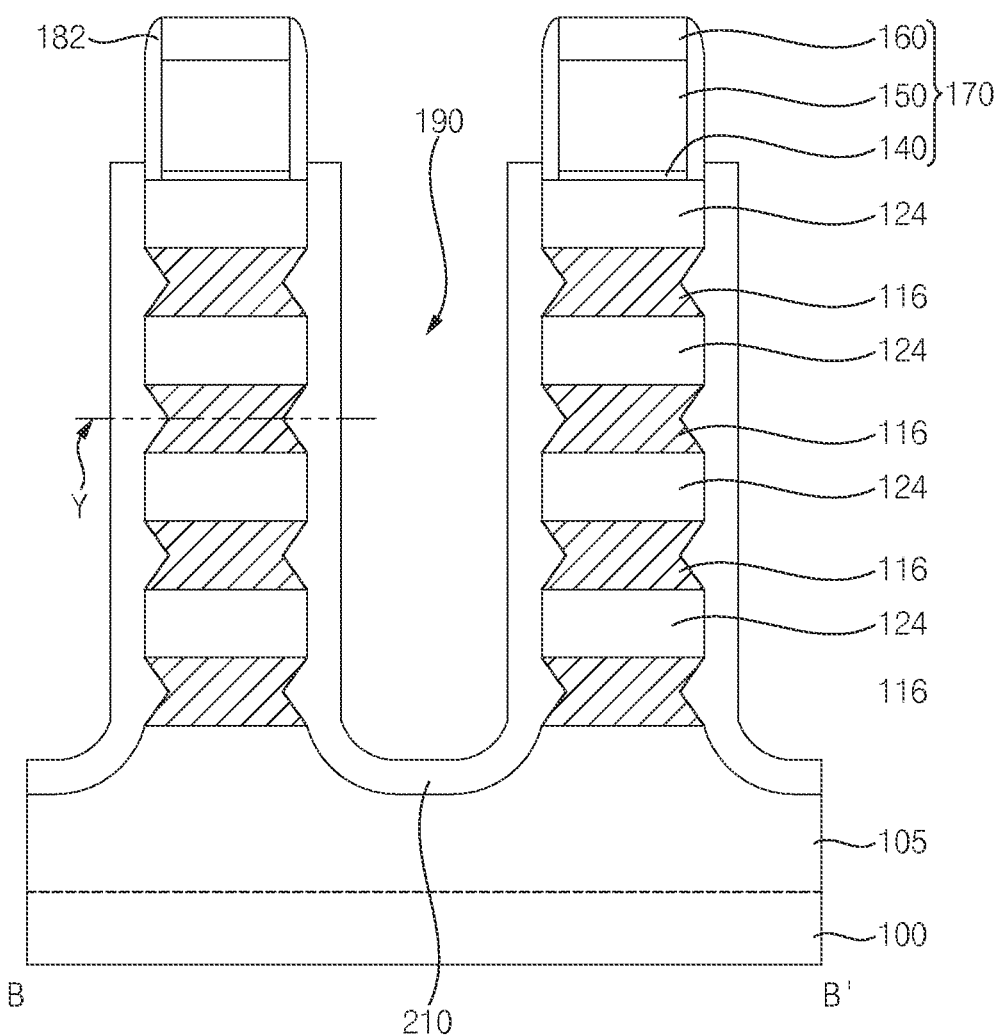
Figure 20:
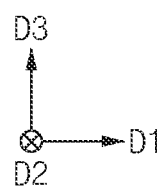
Figure 21:
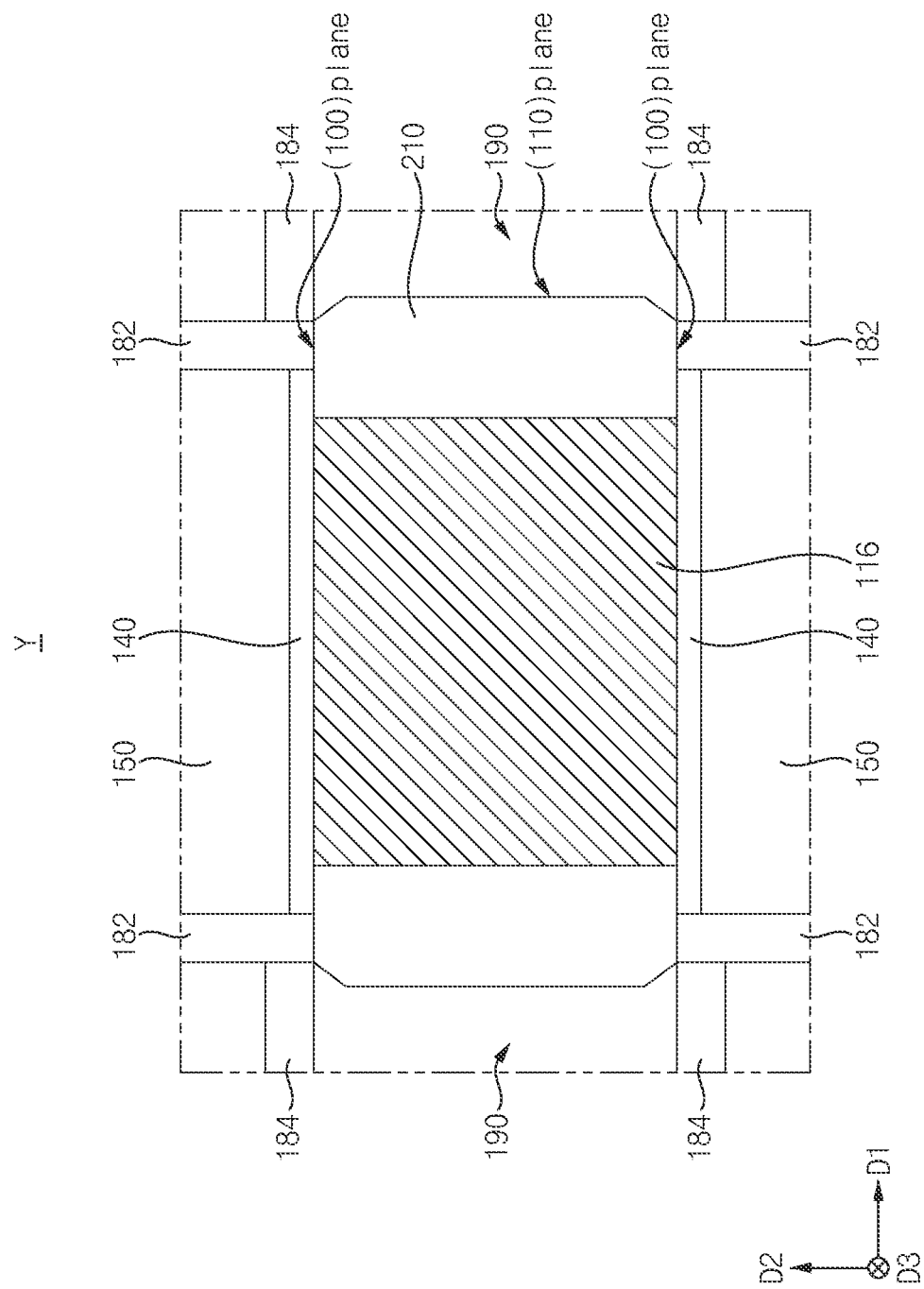
Figure 22:
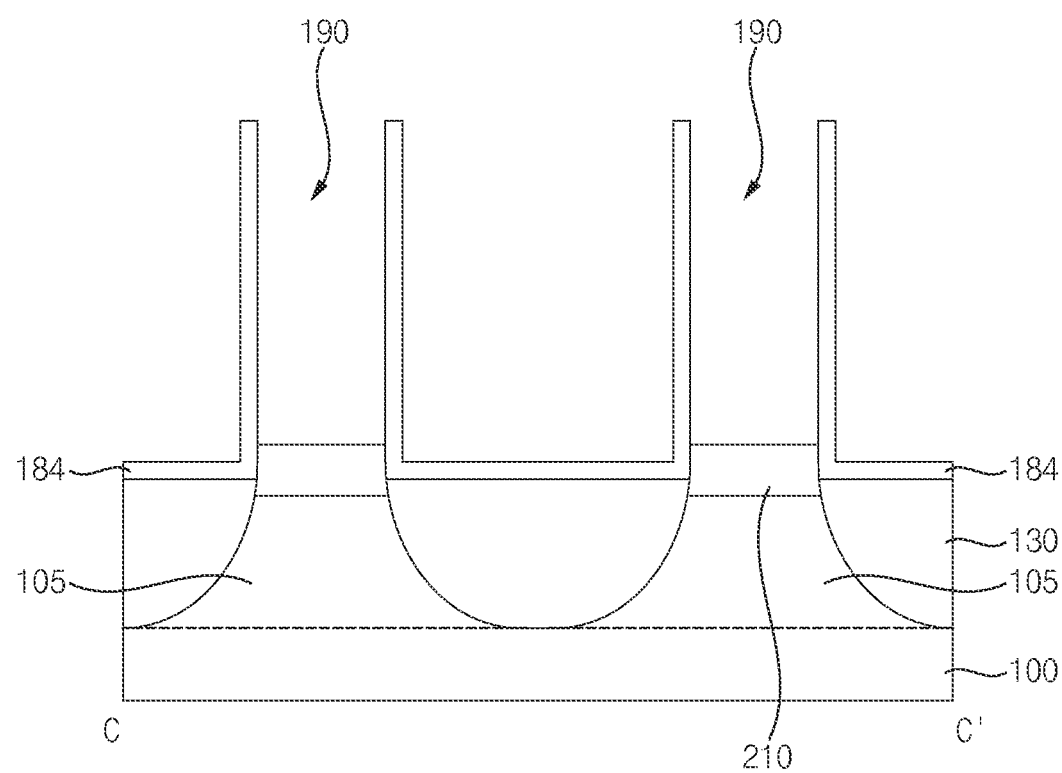

Referring to FIGS. 20 to 22, a first selective epitaxial growth (SEG) process may be performed using an upper surface of the active pattern 105 and sidewalls of the semiconductor patterns 124 and the sacrificial patterns 114 exposed by the first openings 190 as a seed to form a first epitaxial layer 210 in the first opening 190.

The first SEG process may be performed using a silicon source gas, e.g., dichlorosilane ($SiH_2Cl_2$) gas, a germanium source gas, e.g., germane ($GeH_4$) gas, and thus a single crystalline silicon-germanium layer may be formed as the first epitaxial layer 210. A p-type impurity source gas, e.g., diborane ($B_2H_6$) gas, may also be used so that a single crystalline silicon-germanium layer doped with p-type impurities may be formed as the first epitaxial layer 210.

In example embodiments, a germanium concentration of the first epitaxial layer 210 may be lower than that of the sacrificial pattern 116, so that the first epitaxial layer 210 may have an etch selectivity with respect to the sacrificial pattern 116.

The first epitaxial layer 210 may be grown using the (111) plane of a crystal of the sacrificial pattern 116 as a seed. The first epitaxial layer 210 may be grown using each of the opposite sidewalls of the sacrificial pattern 116 having the facet, and thus, may be grown to have a substantially constant thickness when compared to a case in which the first epitaxial layer 210 is grown using each of the opposite sidewalls of the preliminary sacrificial pattern 114 having a shape of a concave curve. In addition, the second recess 20 on each of the opposite sidewalls in the first direction D1 of the first epitaxial layer 210 may be sufficiently filled without voids therein.

Accordingly, at a height of a central portion in the third direction D3 of the sacrificial pattern 116, the first epitaxial layer 210 may completely cover the portion of the dummy gate insulation pattern 140 exposed by the first opening 190.

At the height of the central portion in the third direction D3 of the sacrificial pattern 116, the sidewall in the second direction D2 of the gate spacer 182 exposed by the first opening 190 may be at least partially covered by the first epitaxial layer 210. FIG. 21 shows that the first epitaxial layer 210 completely covers the sidewall in the second direction D2 of the gate spacer 182 exposed by the first opening 190, however, the inventive concept may not be limited thereto.

Figure 23:
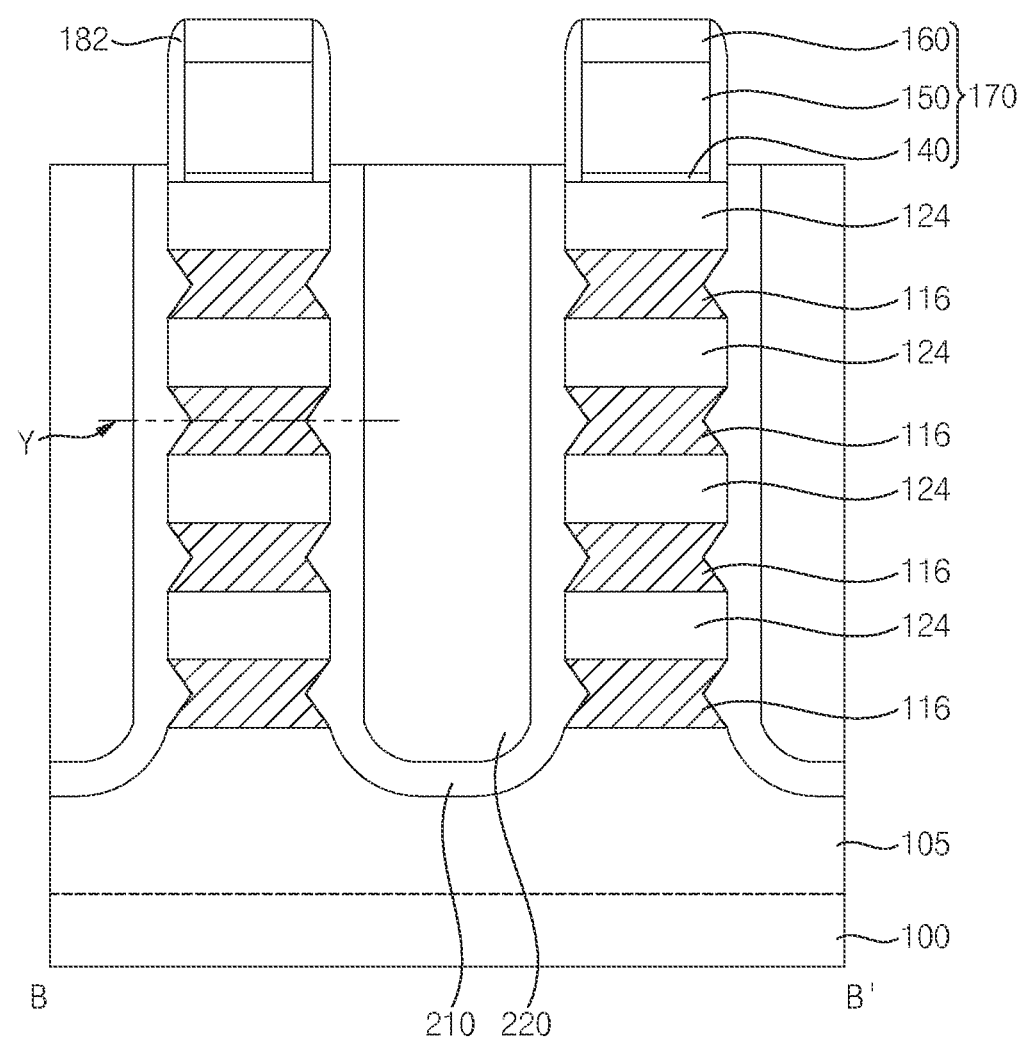
Figure 23:
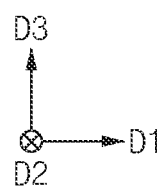
Figure 24:
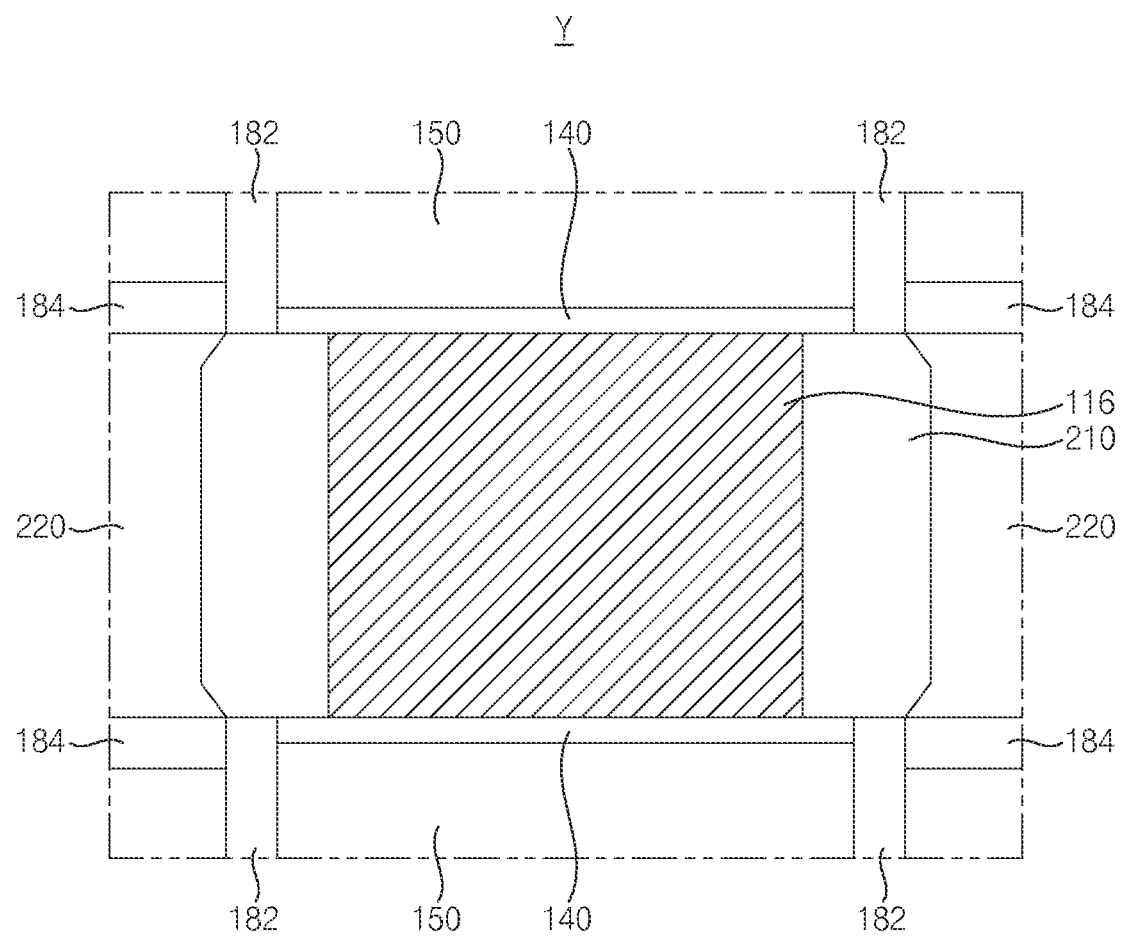
Figure 25:
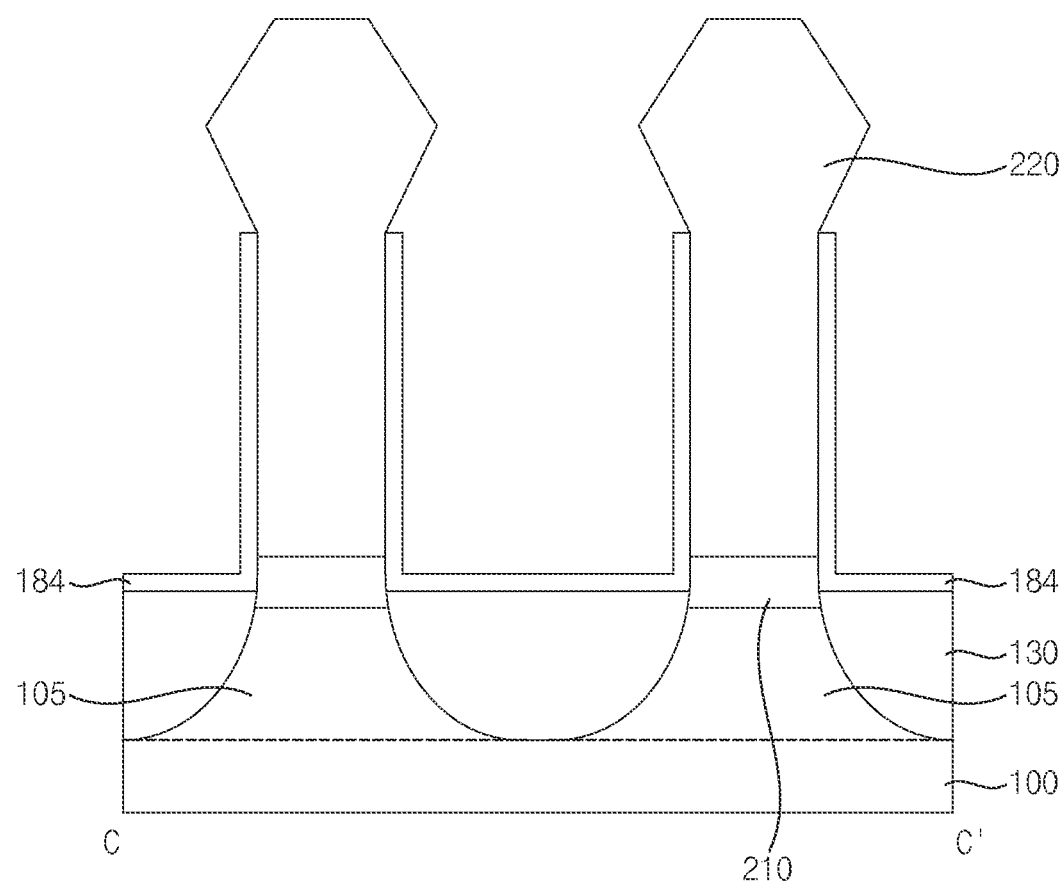

Referring to FIGS. 23 to 25, a second SEG process may be performed using the first epitaxial layer 210 as a seed to form a second epitaxial layer 220.

The second SEG process may be performed using a silicon source gas, e.g., dichlorosilane ($SiH_2Cl_2$) gas, a germanium source gas, e.g., germane ($GeH_4$) gas, and thus a single crystalline silicon-germanium layer may be formed as the second epitaxial layer 220. A p-type impurity source gas, e.g., diborane ($B_2HE$) gas, may also be used so that a single crystalline silicon-germanium layer doped with p-type impurities may be formed as the second epitaxial layer 220. In example embodiments, a germanium concentration of the second epitaxial layer 220 may be greater than that of the first epitaxial layer 210.

Hereinafter, a portion of the second epitaxial layer 220 between the source/drain fence 184 may be referred to as a lower portion, and a portion of the second epitaxial layer 220 above an upper surface of the source/drain fence 184 may be referred to as an upper portion. In example embodiments, a cross-section in the second direction D2 of the upper portion of the second epitaxial layer 220 may have a shape a polygon, e.g., a pentagon or a hexagon.

Figure 26:
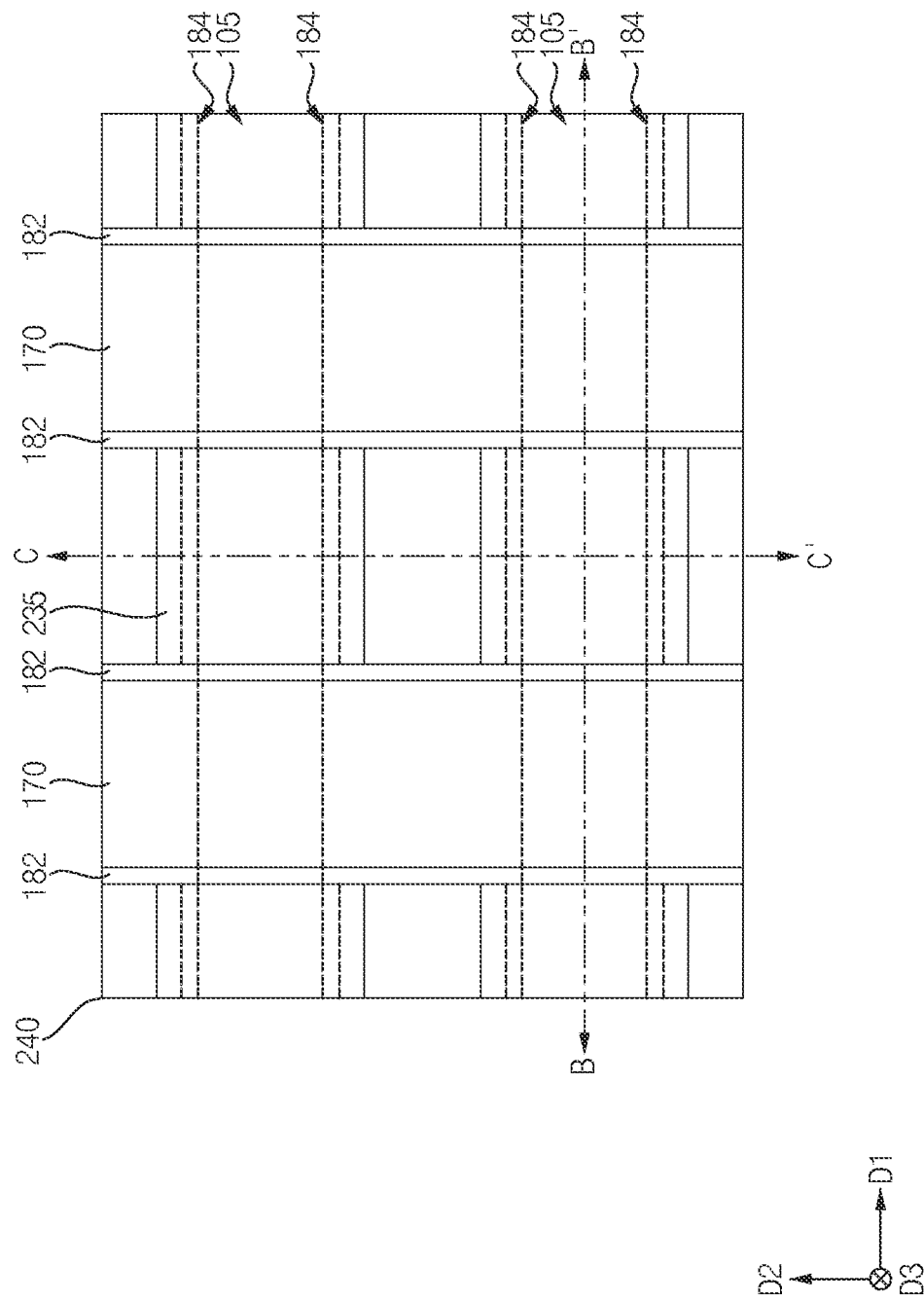
Figure 27:
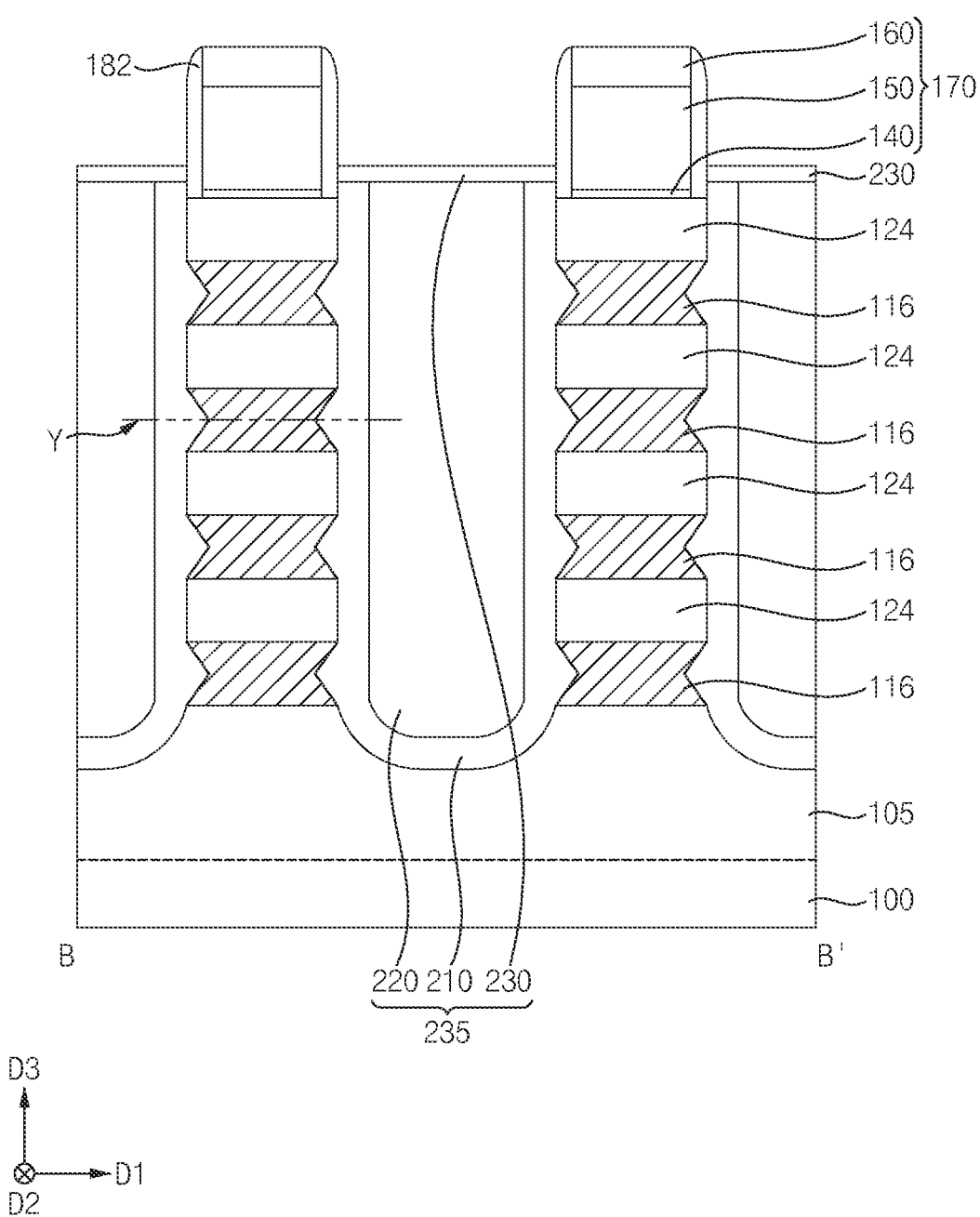
Figure 28:
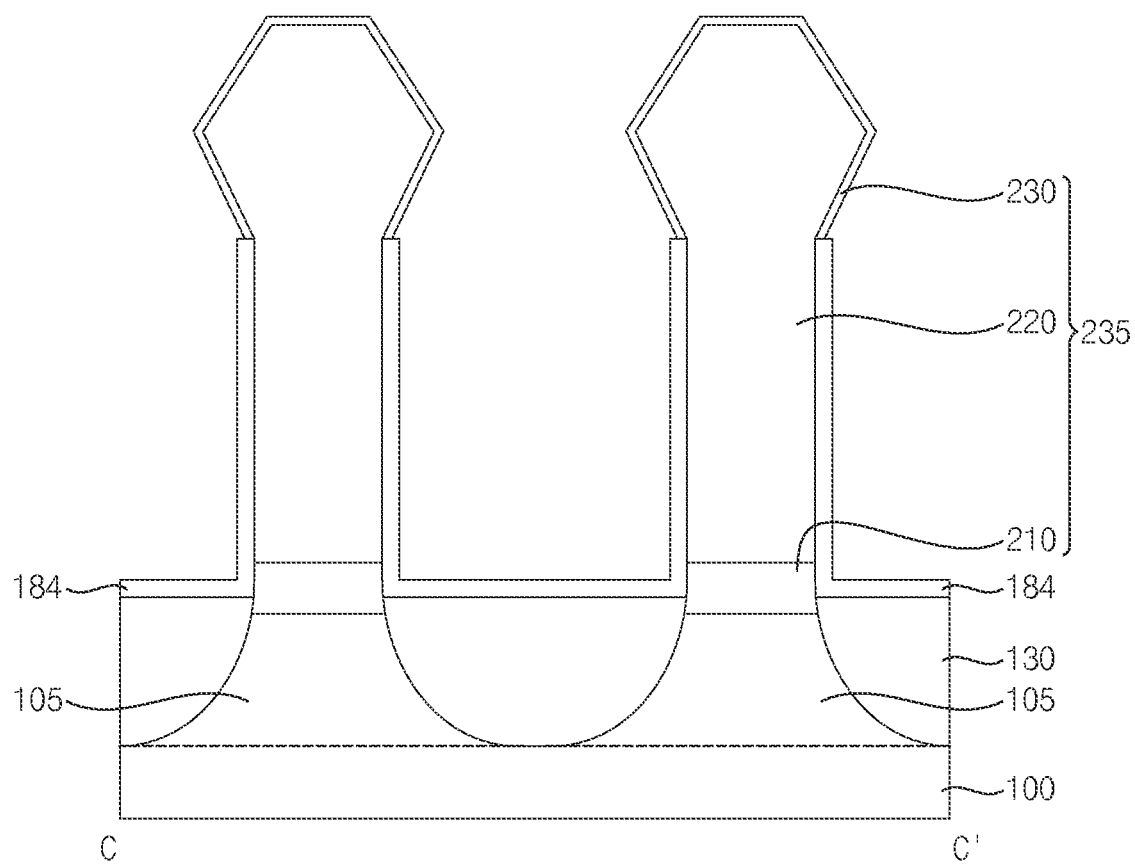

Referring to FIGS. 26 to 28, a third SEG process may be performed using the first and second epitaxial layers 210 and 220 as a seed to form a third epitaxial layer 230.

The third SEG process may be performed using a silicon source gas, e.g., disilane ($Si_2H_6$) gas, and thus a single crystalline silicon layer may be formed as the third epitaxial layer 230.

The first to third epitaxial layers 210, 220 and 230 may collectively form a source/drain layer 235.

Figure 29:
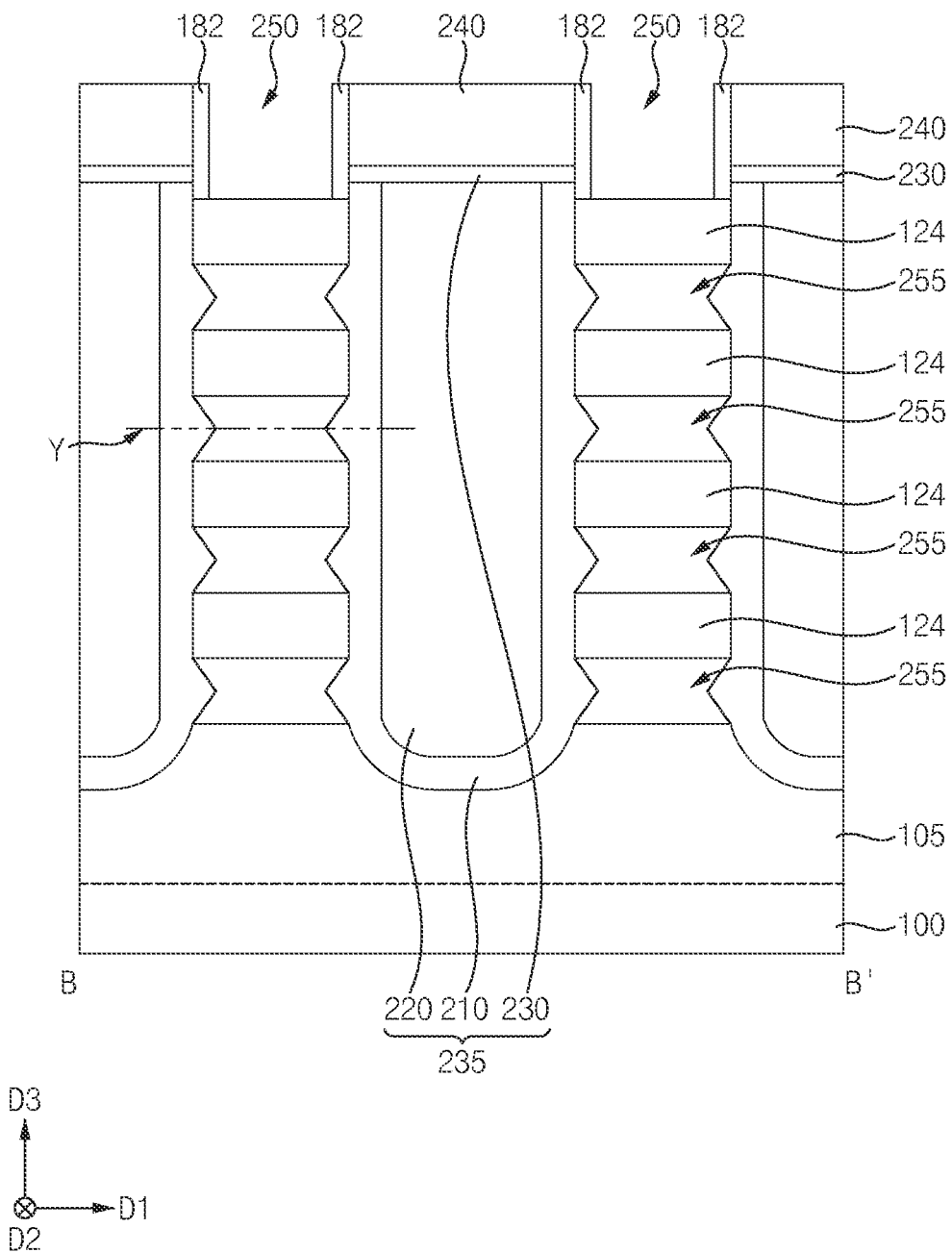
Figure 30:
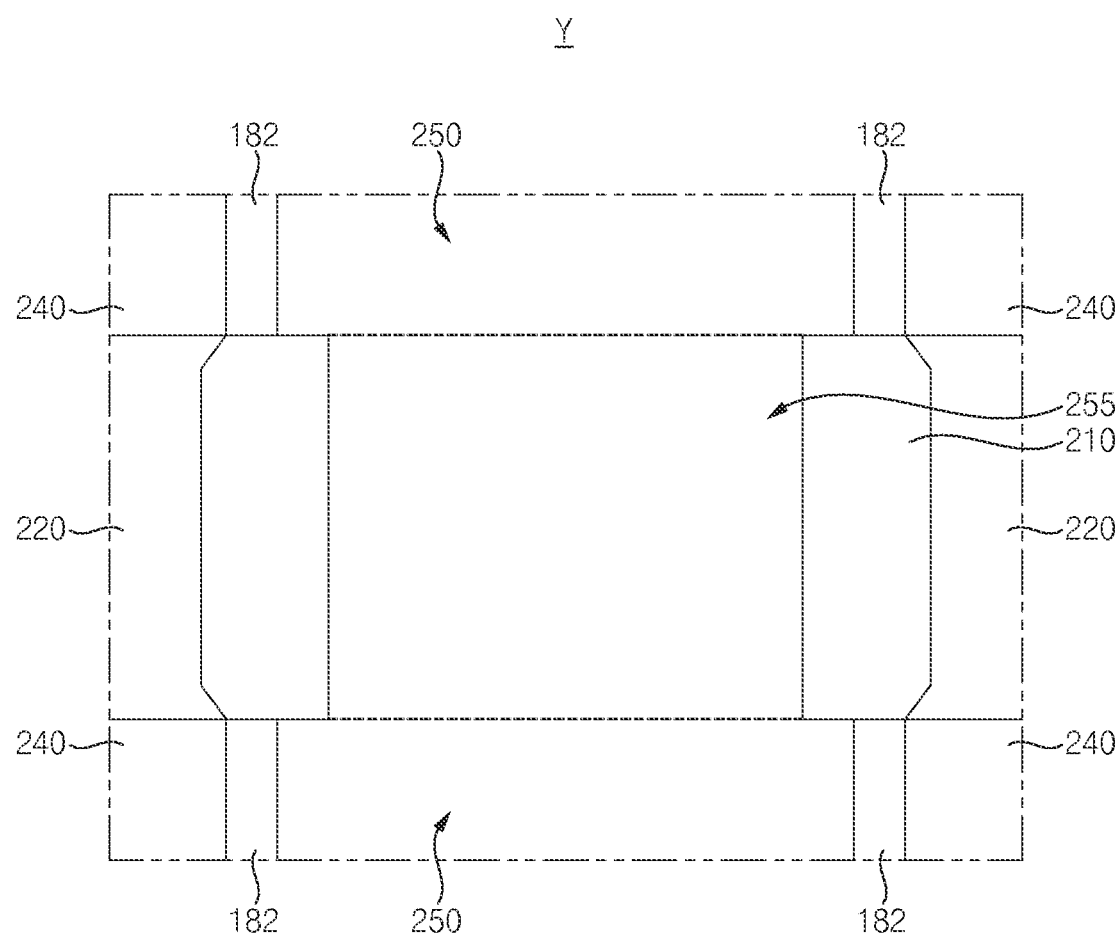

Referring to FIGS. 29 and 30, a first insulating interlayer 240 may be formed on the dummy gate structure 170, the source/drain fence 182 and the source/drain layer 235, and a planarization process may be performed until an upper surface of the dummy gate electrode 150 included in the dummy gate structure 170 is exposed.

The dummy gate electrode 150, the dummy gate insulation pattern 140 and the sacrificial pattern 116 may be removed by, e.g. a wet etching process and/or a dry etching process, and a second opening 250 exposing an inner sidewall of the gate spacer 182 and an upper surface of an uppermost one of the semiconductor patterns 124, and a third opening 255 exposing a sidewall of the first epitaxial layer 210, surfaces of the semiconductor patterns 124 and an upper surface of the active pattern 105 may be formed.

The first epitaxial layer 210 may include silicon-germanium as the sacrificial pattern 116. However, the germanium concentration of the first epitaxial layer 210 may be lower than that of the sacrificial pattern 116, and thus the first epitaxial layer 210 may not be removed during the etching process, and may serve as a buffer for protecting the second epitaxial layer 220. As described above, the first epitaxial layer 210 may fill the second recess 20 on each of the opposite sidewalls in the first direction D1 of the sacrificial pattern 116 without voids therein. Accordingly, an etchant or an etching gas used in the etching process may not penetrate into the second epitaxial layer 220, and thus the second epitaxial layer 220 may be prevented from being damaged.

Figure 31:
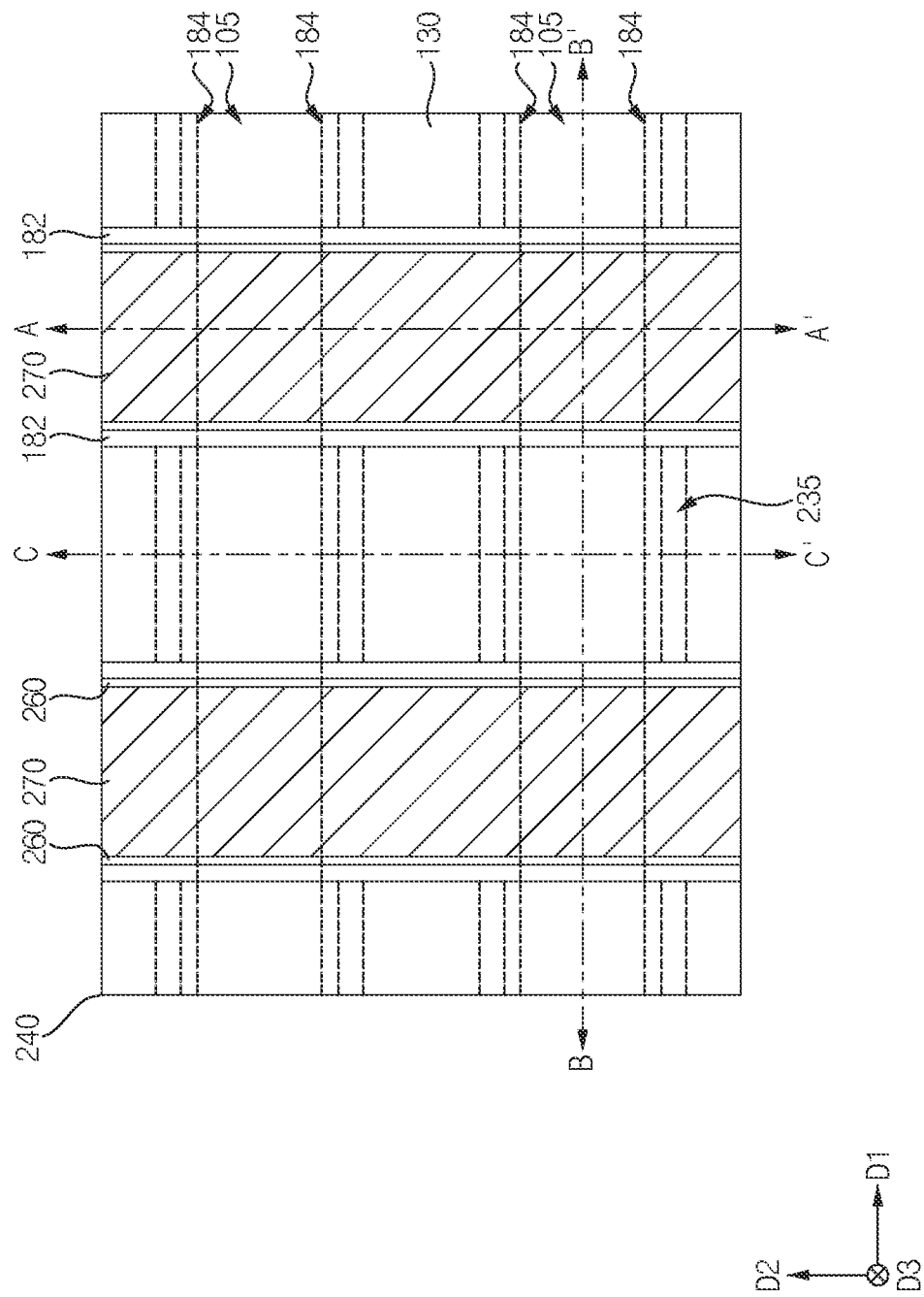
Figure 33:
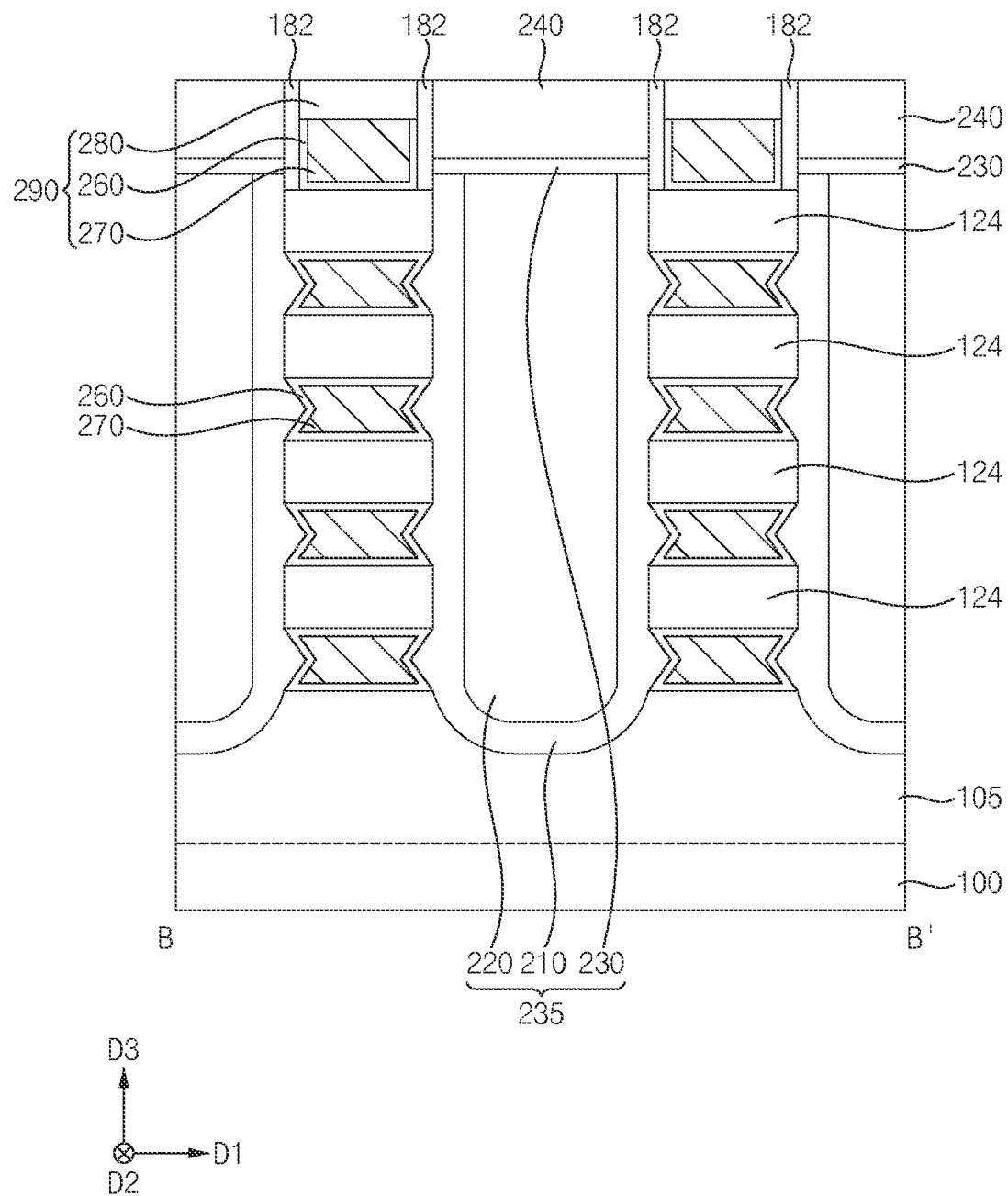

Referring to FIGS. 31 to 33, a gate insulation layer may be formed on the inner sidewall of the gate spacer 182, the surfaces of the semiconductor patterns 124, the upper surface of the active pattern 105, the upper surface of the isolation pattern 130 and the sidewall of the first epitaxial layer 210 exposed by the second and third openings 250 and 255, and an upper surface of the first insulating interlayer 240, and a gate electrode layer may be formed on the gate insulation layer to fill remaining portions of the second and third openings 250 and 255.

In an example embodiment, an interface pattern including, e.g., silicon oxide, may be further formed on the upper surface of the active pattern 105 and the surfaces of the semiconductor patterns 124.

The gate electrode layer and the gate insulation layer may be planarized until the upper surface of the first insulating interlayer 240 is exposed. Thus, a gate insulation pattern 260 and a gate electrode 270 filling the second and third openings 250 and 255 may be formed.

Upper portions of the gate insulation pattern 260 and the gate electrode 270 may be removed to form a third recess, and a capping pattern 280 may be formed in the third recess. The gate insulation pattern 260, the gate electrode 270 and the capping pattern 280 may collectively form a gate structure 290.

Referring to FIGS. 1 to 6 again, a second insulating interlayer 300 may be formed on the capping pattern 280, the gate spacer 182 and the first insulating interlayer 240, and a first contact plug 320 extending through the first and second insulating interlayers 240 and 300 and an upper portion of the source/drain layer 235 may be formed.

A third insulating interlayer 330 may be formed on the first contact plug 320 and the second insulating interlayer 300, and a second contact plug 340 extending though the third insulating interlayer 330 and the capping pattern 280 to contact an upper surface of the gate electrode 270, and a via 350 extending through the third insulating interlayer 330 to contact an upper surface of the first contact plug 320 may be formed.

In an example embodiment, an ohmic contact pattern 310 may be further formed between the first contact plug 320 and the source/drain layer 235.

Upper insulating interlayers, contact plugs and upper wirings may be further formed to complete the fabrication of the semiconductor device.

As illustrated above, after forming the dummy gate structure 170 and the gate spacer 182 on the fin structure including the sacrificial line 112 and the semiconductor line 122 alternately stacked on the active pattern 105, the etching process using the dummy gate structure 170 and the gate spacer 182 as an etching mask may be performed. Accordingly, the sacrificial line 112 and the semiconductor line 122 may be transformed to the preliminary sacrificial pattern 114 and the semiconductor pattern 124, respectively.

During the etching process, due to the etching selectivity between the semiconductor line 122 and the sacrificial line 112, the first recess 10 having a shape of a concave curve may be formed on each of the opposite sidewalls in the first direction D1 of the preliminary sacrificial pattern 114, and the sidewall of the dummy gate insulation pattern 140 included in the dummy gate structure 170 may be partially exposed.

An additional etching process may be performed on each of the opposite sidewalls in the first direction D1 of the preliminary sacrificial pattern 114 to form the sacrificial pattern 116. Accordingly, each of the opposite sidewalls in the first direction D1 of the sacrificial pattern 116 may have the (111) plane of a crystal, and the second recess 20 having a shape of a "V" may be formed thereon. In other words, triangular recesses may be formed in the sidewalls of the sacrificial patterns 116.

The first epitaxial layer 210 may be formed by the first SEG process, which may use the opposite sidewalls in the first direction D1 of the sacrificial patterns 116 and the semiconductor patterns 124 as a seed. Accordingly, the first epitaxial layer 210 may be formed to have a constant thickness, and may fill the second recess 20 without voids therein to cover the exposed sidewall of dummy gate insulation pattern 140.

Hence, during the etching process to remove the dummy gate structure 170 and the sacrificial pattern 116, the first epitaxial layer 210, which may have an etching selectivity with respect to the sacrificial pattern 116, may protect the first epitaxial layer 210 by covering the second epitaxial layer 220.

Figure 34:
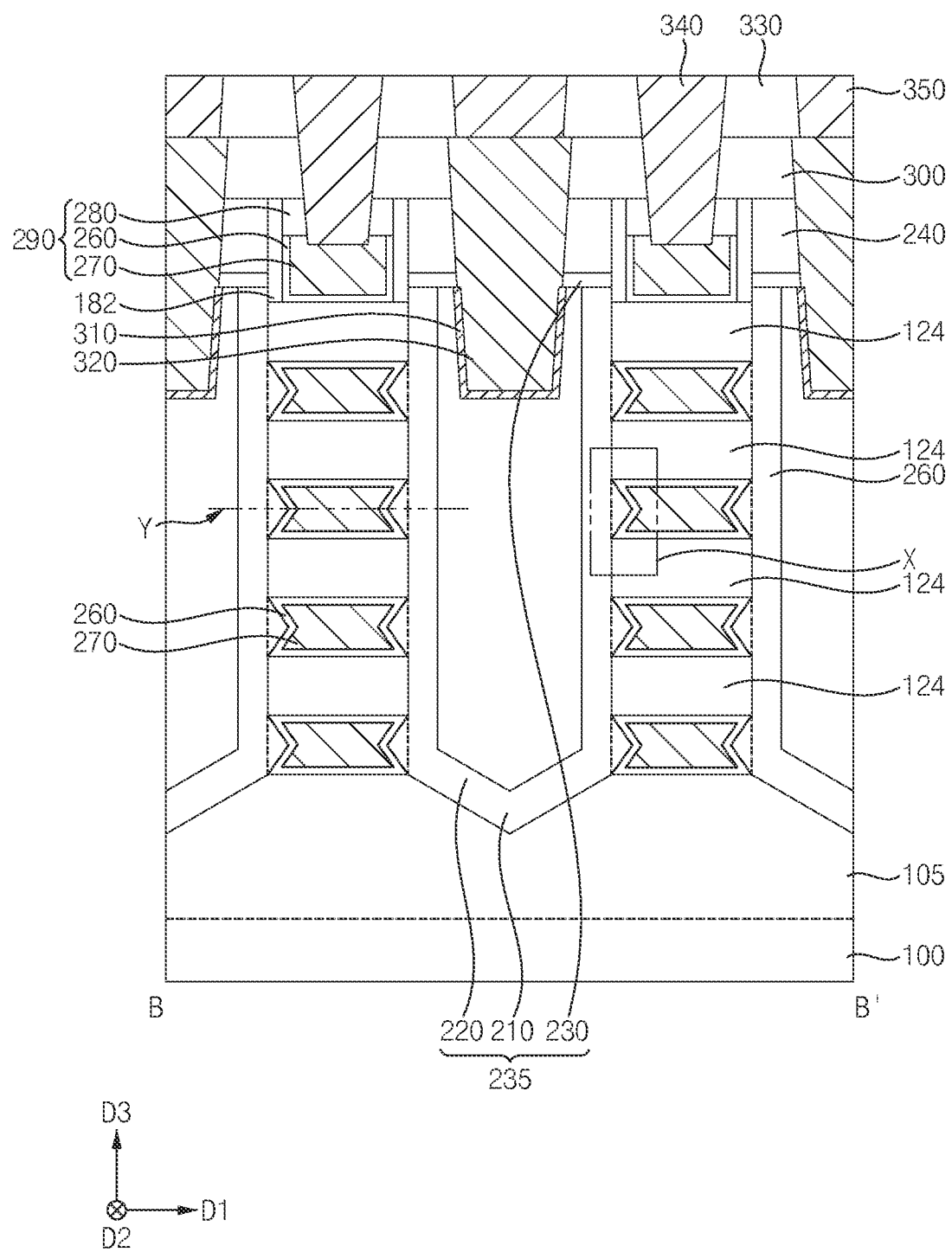
FIG. 34 is a cross-sectional view illustrating a semiconductor device according to example embodiments of the inventive concept.

FIG. 34 is a cross-sectional view illustrating a semiconductor device in accordance with example embodiments, and may correspond to FIG. 3.

This semiconductor device may be substantially the same as or similar to that of FIGS. 1 to 6, except for the shape of the upper surface of the active pattern 105, and thus repeated explanations thereof are omitted herein.

Referring to FIG. 34, during the process of forming the first opening 190 illustrated with reference to FIGS. 12 to 16, an upper portion of the active pattern 105 may be over-etched so that a cross-section of the upper surface of the active pattern 105 in the first direction D1 may have a shape of a "V". For example, the upper surface of the active pattern 105 may have slanted sides and form a "V" shape.

Accordingly, a cross-section in the first direction D1 of a lower surface of the first epitaxial layer 210, which may be formed on the active pattern 105 and may contact the active pattern 105, may also have shape of a "V" In other words, the lower surface of the first epitaxial layer 210 in contact with the active pattern 105 may have a shape conforming to the upper surface of the active pattern 105.

Figure 35:
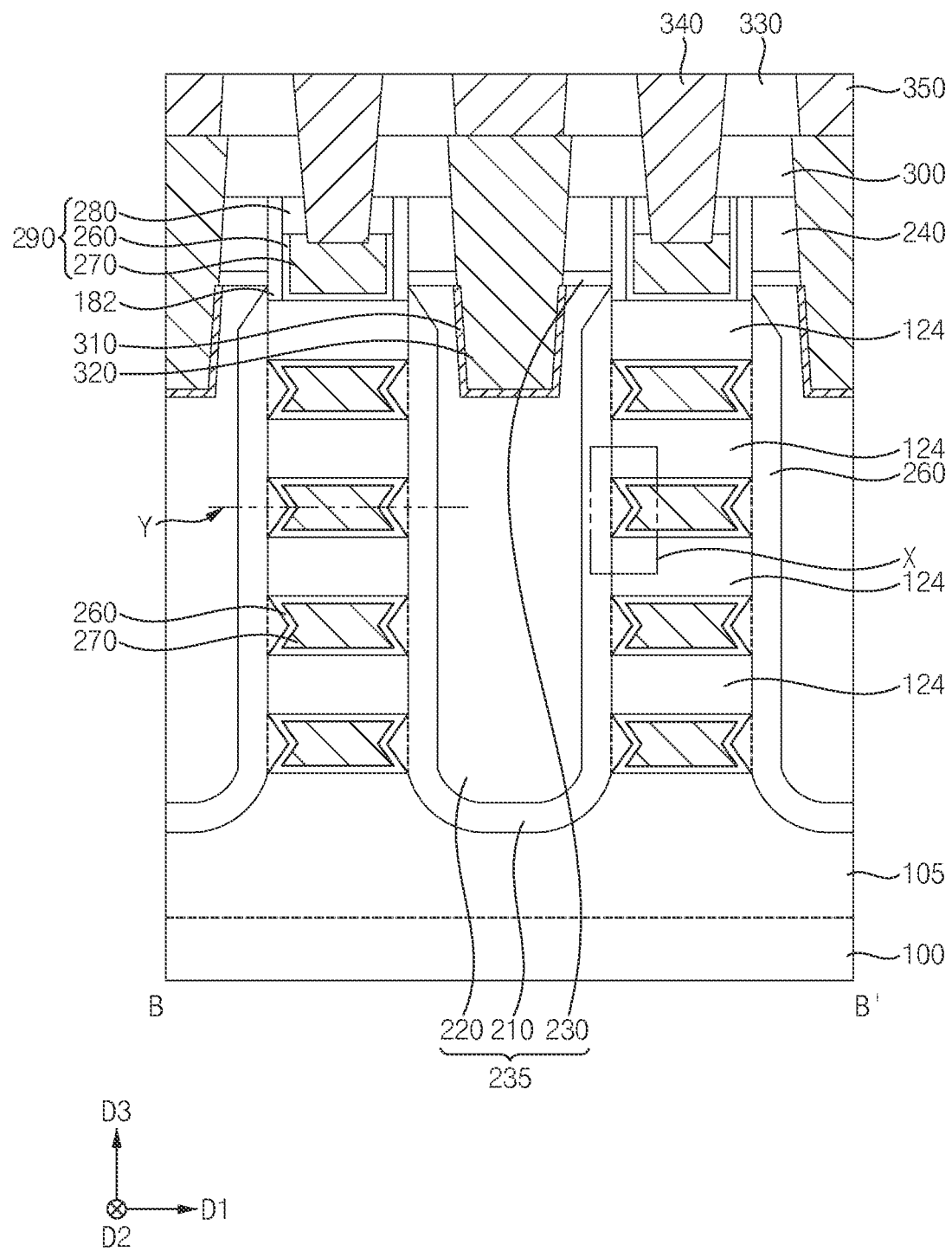
FIG. 35 is a cross-sectional view illustrating a semiconductor device according to example embodiments of the inventive concept.

FIG. 35 is a cross-sectional view illustrating a semiconductor device in accordance with example embodiments, and may correspond to FIG. 3.

This semiconductor device may be substantially the same as or similar to that of FIGS. 1 to 6, except for the shape of an upper surface of the first epitaxial layer 210, and thus repeated explanations thereof are omitted herein.

Referring to FIG. 35, a width in the first direction D1 of an upper portion of the first epitaxial layer 210 may decrease further away from the upper surface of the substrate 100, and an inner sidewall in the first direction D1 of the upper portion of the first epitaxial layer 210 may have, e.g., the (111) plane of a crystal. In this case, for example, the second epitaxial layer 220 may be wider near the top of the source/drain layer 235 than at the bottom of the source/drain layer 235.

Figure 36:
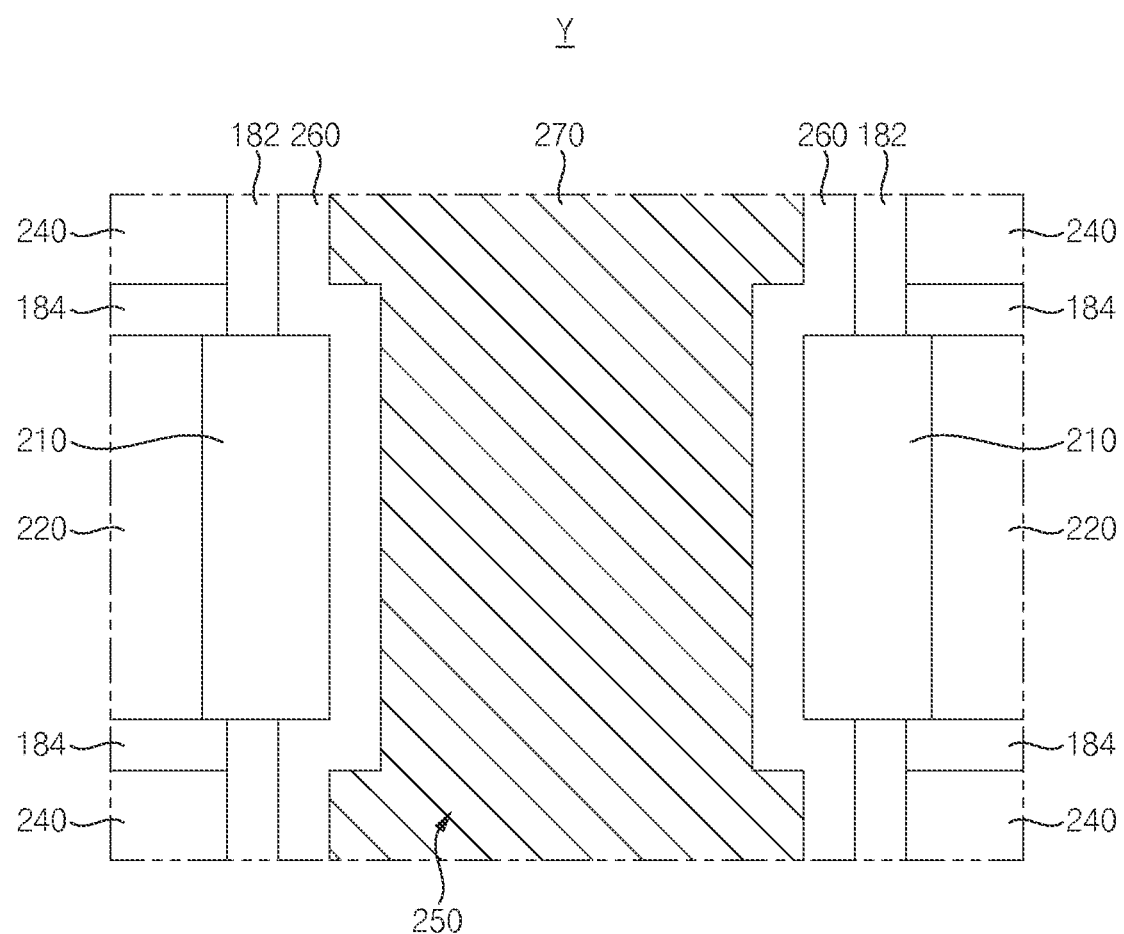
FIG. 36 is a cross-sectional view illustrating a semiconductor device according to example embodiments of the inventive concept.

FIG. 36 is a cross-sectional view illustrating a semiconductor device in accordance with example embodiments, and may correspond to FIG. 5.

This semiconductor device may be substantially the same as or similar to that of FIGS. 1 to 6, except for the shape of the protruding portion of the first epitaxial layer 210, and thus repeated explanations thereof are omitted herein.

Referring to FIGS. 36, a horizontal cross-section of the first portion of the first epitaxial layer 210 may have a shape of a rectangle. In an example embodiment, the first portion of the first epitaxial layer 210 may have the (100) plane of a crystal.

Figure 37:
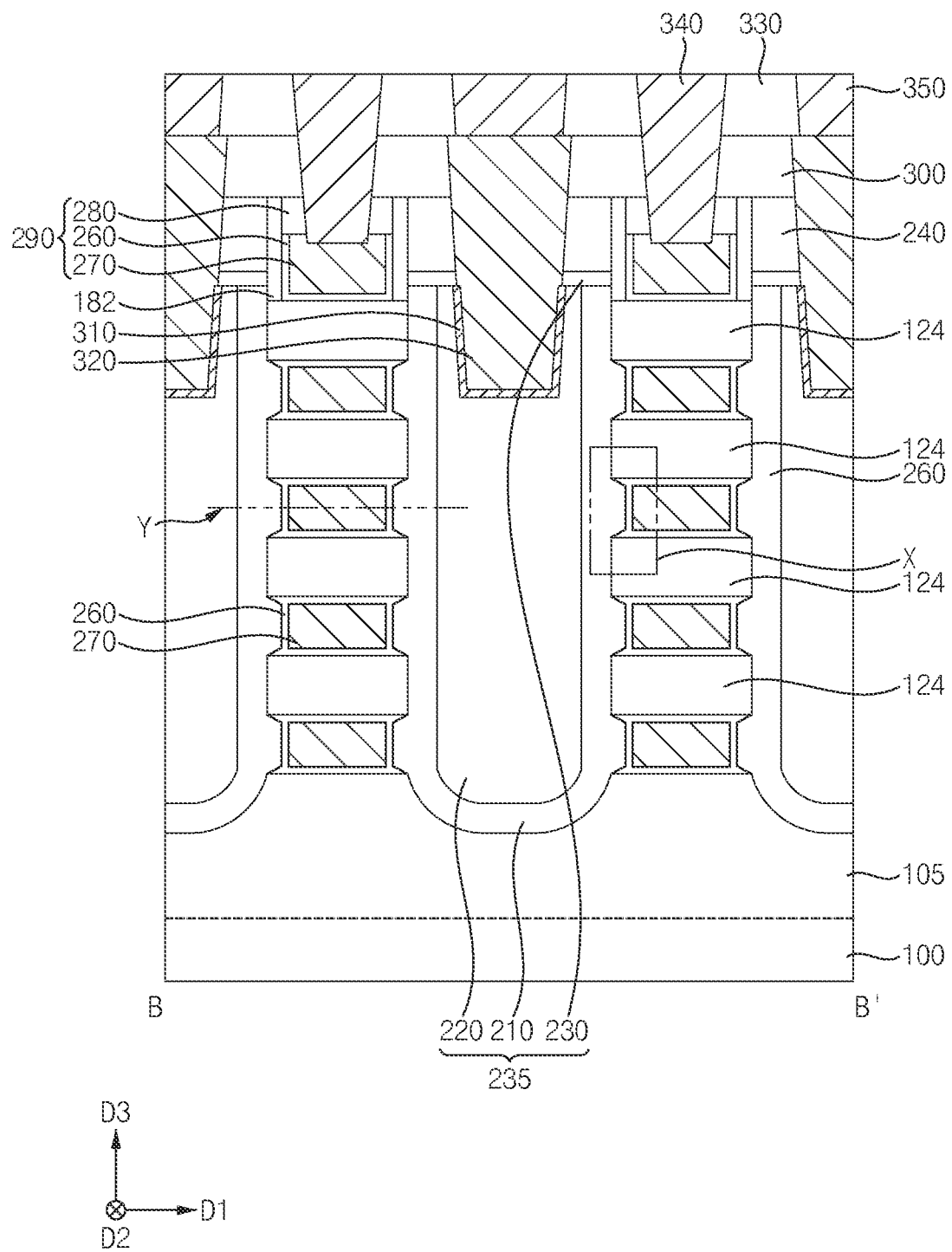
FIGS. 37 and 38 are cross-sectional views illustrating a semiconductor device according to example embodiments of the inventive concept.
Figure 38:
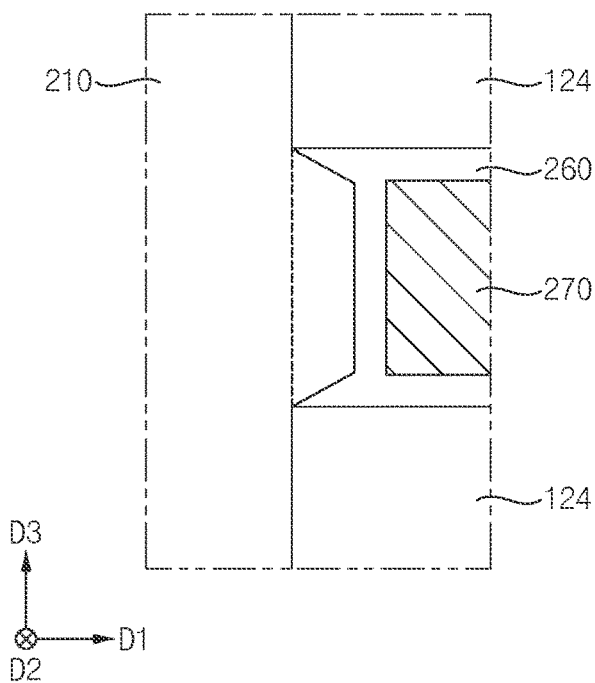

FIGS. 37 to 38 are cross-sectional views illustrating a semiconductor device in accordance with example embodiments, and may correspond to FIGS. 3 and 4, respectively.

Referring to FIGS. 37 and 38, a cross-section in the first direction D1 of the protruding portion of the first epitaxial layer 210 may have a shape of a trapezoid. In an example embodiment, a portion of a surface of the protruding portion of the first epitaxial layer 210 facing the gate structure 290 may have the (110) plane of a crystal.

Figure 39:
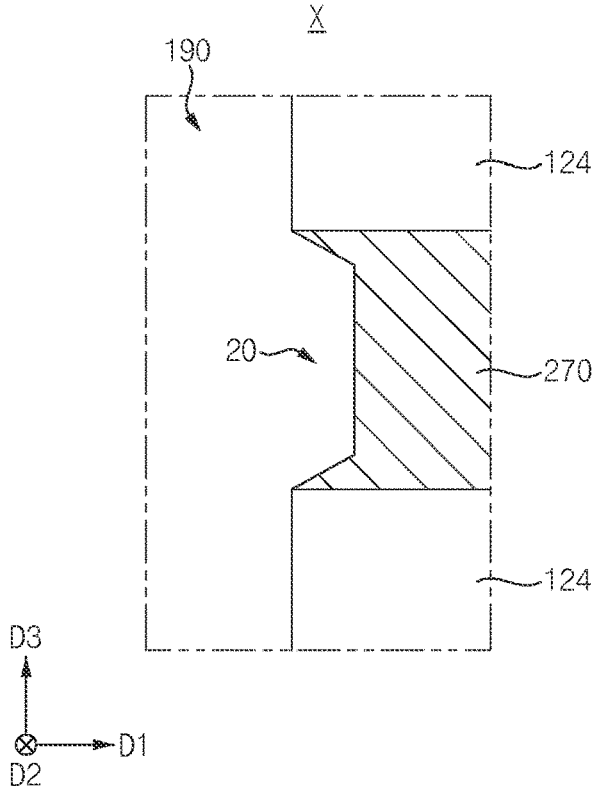
FIG. 39 is a cross-sectional view illustrating a method of manufacturing a semiconductor device according to example embodiments of the inventive concept.

FIG. 39 is a cross-sectional view illustrating a method of manufacturing a semiconductor device in accordance with example embodiments, and may correspond to FIG. 18

This method may include processes substantially the same as or similar to those illustrated with reference to FIGS. 7 to 33 and FIGS. 1 to 6, and thus repeated explanations thereof are omitted herein.

Referring to FIG. 39, processes substantially the same as or similar to those illustrated with reference to FIGS. 7 to 19 may be performed.

However, unlike the processes illustrated with reference to FIGS. 17 to 19, each of the opposite sidewalls in the first direction D1 of the sacrificial pattern 116 may have the (110) plane of a crystal, instead of the (111) plane of a crystal. Accordingly, a cross-section in the first direction D1 of the protruding portion of the first epitaxial layer 210 grown by using the sacrificial pattern 116 as a seed may be formed to have the (110) plane of a crystal.

Processes substantially the same as or similar to those illustrated with reference to FIGS. 20 to 33 and FIGS. 1 to 6 may be performed to complete the fabrication of the semiconductor device.

Although a few example embodiments have been described, those skilled in the art will readily appreciate that many modifications are possible without materially departing from the scope of the inventive concept set forth herein.

What is claimed is:

1. A semiconductor device, comprising:
    channels spaced apart from each other on a substrate in a third direction substantially perpendicular to an upper surface of the substrate, each of the channels extending in a first direction substantially parallel to the upper surface of the substrate;
    a gate structure extending on the substrate in a second direction substantially parallel to the upper surface of the substrate and crossing the first direction, the gate structure surrounding lower and upper surfaces and sidewalls of each of the channels; and
    a source/drain layer on the substrate, the source/drain layer contacting sidewalls of the channels and containing silicon-germanium, the source/drain layer including:
        a second epitaxial layer having a second germanium concentration; and
        a first epitaxial layer having a first germanium concentration smaller than the second germanium concentration, the first epitaxial layer covering a lower surface and sidewalls of the second epitaxial layer,
    wherein the first epitaxial layer includes a protruding portion that protrudes in the first direction and contacts the gate structure, and
    wherein the protruding portion has a facet that is not curved.

2. The semiconductor device as claimed in claim 1, wherein a cross-section in the first direction, the facet has a shape of a triangle.

3. The semiconductor device as claimed in claim 2, wherein the facet has a (111) plane of a crystal.

4. The semiconductor device as claimed in claim 1, wherein a cross-section in the first direction, the facet has a shape of a trapezoid.

5. The semiconductor device as claimed in claim 4, wherein the facet has a (110) plane of a crystal.

6. The semiconductor device as claimed in claim 1, further comprising:
    a gate spacer covering sidewalls of the gate structure,
    wherein the protruding portion of the first epitaxial layer contacts at least a portion of at least one of the sidewalls of the gate spacer.

7. The semiconductor device as claimed in claim 1, wherein a horizontal cross-section of a first portion of the first epitaxial layer has a shape of a hexagon, the first portion of the first epitaxial layer being at a height of the protruding portion.

8. The semiconductor device as claimed in claim 7, wherein the first portion of the first epitaxial layer has a (100) plane of a crystal and a (110) plane of a crystal.

9. The semiconductor device as claimed in claim 1, wherein a horizontal cross-section of a first portion of the first epitaxial layer has a shape of a square, the first portion of the first epitaxial layer being at a height of the protruding portion.

10. The semiconductor device as claimed in claim 9, wherein the first portion of the first epitaxial layer has a (100) plane of a crystal.

11. A semiconductor device, comprising:
    channels spaced apart from each other on a substrate in a third direction substantially perpendicular to an upper surface of the substrate, each of the channels extending in a first direction substantially parallel to the upper surface of the substrate;
    a gate structure extending on the substrate in a second direction substantially parallel to the upper surface of the substrate and crossing the first direction, the gate structure surrounding lower and upper surfaces and sidewalls of each of the channels;
    a gate spacer covering sidewalls of the gate structure; and
    a source/drain layer on the substrate, the source/drain layer contacting sidewalls of the channels and containing silicon-germanium, the source/drain layer including:
        a second epitaxial layer having a second germanium concentration; and
        a first epitaxial layer having a first germanium concentration smaller than the second germanium concentration, the first epitaxial covering a lower surface and sidewalls of the second epitaxial layer,
    wherein the first epitaxial layer includes a protruding portion that protrudes in the first direction and contacts the gate structure,
    wherein the protruding portion of the first epitaxial layer contacts at least a portion of a sidewall of the gate spacer in the second direction, and
    wherein the protruding portion of the first epitaxial layer has a (111) plane of a crystal.

12. The semiconductor device as claimed in claim 11, wherein a horizontal cross-section of a first portion of the first epitaxial layer has a shape of a hexagon, the first portion of the first epitaxial layer being at a height of the protruding portion.

13. The semiconductor device as claimed in claim 12, wherein the first portion of the first epitaxial layer has a (100) plane of a crystal and a (110) plane of a crystal.

14. The semiconductor device as claimed in claim 11, wherein a horizontal cross-section of a first portion of the first epitaxial layer has a shape of a square, the first portion of the first epitaxial layer being at a height of the protruding portion.

15. A method of manufacturing a semiconductor device, the method comprising:
    forming a fin structure on a substrate, the fin structure including sacrificial lines and semiconductor lines alternately and repeatedly stacked in a direction substantially perpendicular to an upper surface of the substrate;

forming a dummy gate structure and a gate spacer on the substrate to partially cover the fin structure;

performing a first etching process on the fin structure by using the dummy gate structure and the gate spacer as an etching mask to partially remove the fin structure so that a first opening is formed to expose the upper surface of the substrate;

performing a second etching process on the sacrificial lines exposed by the first opening so that a sidewall of each of the sacrificial lines has a facet that is not a curved;

performing a selective epitaxial growth (SEG) process using a sidewall of the fin structure and the upper surface of the substrate exposed by the first opening as a seed to form a source/drain layer containing silicon-germanium;

removing the dummy gate structure and the sacrificial lines to form second and third openings, respectively; and forming a gate structure in the second and third openings.

16. The semiconductor device as claimed in claim 15, wherein the first etching process includes a dry etching process, and wherein a first recess is formed on a sidewall of each of the sacrificial lines exposed by the first opening, the first recess having a shape of a concave curve.

17. The semiconductor device as claimed in claim 16, wherein the second etching process includes a wet etching process using ammonium hydroxide (NH$_4$OH) as an etchant, and wherein a second recess is formed on the sidewall of each of the sacrificial lines, the second recess having a shape of a "V".

18. The semiconductor device as claimed in claim 16, wherein the dummy gate structure includes a dummy gate insulation pattern and a dummy gate electrode, and wherein forming the first opening includes exposing a portion of the dummy gate insulation pattern by the first recess.

19. The semiconductor device as claimed in claim 18, wherein forming the source/drain layer includes forming the source/drain layer to cover the exposed portion of the dummy gate insulation pattern.

20. The semiconductor device as claimed in claim 15, wherein forming the source/drain layer includes:

performing a first SEG process using the sidewall of the fin structure and the upper surface of the substrate exposed by the first opening as a seed to form a first epitaxial layer on an inner sidewall of the first opening, the first epitaxial layer having a first germanium concentration; and performing a second SEG process using the first epitaxial layer as a seed to form a second epitaxial layer in the first opening on the first epitaxial layer, the second epitaxial layer having a second germanium concentration greater than the first germanium concentration.

* * * * *